(12) United States Patent
Wang

(10) Patent No.: US 7,799,619 B2
(45) Date of Patent: Sep. 21, 2010

(54) THIN FILM TRANSISTOR ARRAY SUBSTRATE AND FABRICATING METHOD THEREOF

(75) Inventor: Ching-Yi Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 245 days.

(21) Appl. No.: 11/768,202

(22) Filed: Jun. 26, 2007

(65) Prior Publication Data

US 2008/0111132 A1      May 15, 2008

(30) Foreign Application Priority Data

Nov. 13, 2006   (TW) .............................. 95141894 A

(51) Int. Cl.
*H01L 21/00* (2006.01)
(52) U.S. Cl. .................. 438/149; 257/59; 257/E25.005
(58) Field of Classification Search ................ 438/149; 257/59, 88, E25.002, E25.005, E25.019
See application file for complete search history.

(56) References Cited

U.S. PATENT DOCUMENTS

| 6,894,735 | B2 | 5/2005 | Chae et al. | |
|---|---|---|---|---|
| 2002/0079501 | A1* | 6/2002 | Okada et al. | 257/88 |
| 2005/0078264 | A1* | 4/2005 | Yoo et al. | 349/152 |
| 2006/0292763 | A1* | 12/2006 | Hwang et al. | 438/154 |
| 2007/0105052 | A1* | 5/2007 | Chang et al. | 430/313 |
| 2007/0218601 | A1* | 9/2007 | Seo et al. | 438/151 |
| 2008/0012008 | A1* | 1/2008 | Song et al. | 257/40 |

* cited by examiner

*Primary Examiner*—Fernando L Toledo
(74) *Attorney, Agent, or Firm*—Jianq Chyun IP Office

(57) ABSTRACT

A thin film transistor array substrate and a fabricating method thereof are disclosed. First, a substrate is provided. A patterned transparent conductive layer is then formed on the substrate. Next, a patterned first metal layer is formed to form a plurality of scan lines and a plurality of gates. Thereafter, a gate insulation layer is formed over the substrate. Moreover, a patterned semiconductor layer is formed to form a channel layer above the gates. The semiconductor layer is patterned with the same mask as that for patterning the transparent conductive layer. Additionally, a patterned second metal layer is formed to form a plurality of data lines, a plurality of sources, and a plurality of drains. After that, a dielectric layer is formed over the substrate. Finally, pixel electrodes are formed on the dielectric layer.

20 Claims, 21 Drawing Sheets

THIN FILM TRANSISTOR ARRAY SUBSTRATE AND FABRICATING METHOD THEREOF

CROSS-REFERENCE TO RELATED APPLICATION

This application claims the priority benefit of Taiwan application serial no. 95141894, filed Nov. 13, 2006. All disclosure of the Taiwan application is incorporated herein by reference.

BACKGROUND OF THE INVENTION

1. Field of the Invention

The present invention relates to an active device array substrate and a fabricating method thereof. More particularly, the present invention relates to a thin film transistor (TFT) array substrate and a fabricating method thereof.

2. Description of Related Art

Currently, the multimedia technology has become very developed due to the advancement of semiconductor devices or display apparatuses. As to displays, liquid crystal display (LCD) having such characteristics as high image quality, high space efficiency, low power consumption, and no radiation has become the mainstream in the display market.

An LCD panel includes a thin film transistor (TFT) array substrate, a color filter substrate, and a liquid crystal layer between the two. Generally speaking, the TFT array substrate has a plurality of pixel structures arranged as an array, and the pixel structures of a conventional TFT array substrate have to go through at least 5 mask processes to be completed. The first mask process is to define gates, scan lines, and common lines, the second mask process is to define a channel layer, the third mask process is to define sources, drains, and data lines, the fourth mask process is to define a passivation layer, and the fifth mask process is to define pixel electrodes.

Moreover, each of the pixel electrodes covers one of the common lines to form a storage capacitor. Generally speaking, the higher the aperture ratio of the pixel structures is, the higher the luminous efficiency of the entire LCD is. The common lines may affect the aperture ratio of the pixel structures since they are located below the pixel electrode. To resolve this problem, transmissive conductive material such as indium tin oxide (ITO) may be adopted as the material of the common lines to improve the aperture ratio of the pixel structures. However, an additional mask process for defining the common lines is required when fabricating the common lines with conductive material, thus, the manufacturing cost is increased, and since the resistance of the conductive material is higher than that of conventionally used metal material, power consumption and accordingly signal distortion may be caused.

SUMMARY OF THE INVENTION

Accordingly, the present invention is directed to provide a method of fabricating a thin film transistor (TFT) array substrate, wherein transmissive common lines are fabricated with less mask processes to simplify the fabricating process and further to reduce fabricating cost.

The present invention is also directed to a TFT array substrate of low fabricating cost, and the TFT array substrate has improved pixel aperture ratio.

The present invention is further directed to a TFT array substrate having high pixel aperture ratio, wherein the common lines of the TFT array substrate have both transmissive and very good conductive characteristics such that signal distortion is reduced.

As embodied and broadly described herein, the present invention provides a method of fabricating a TFT array substrate. The fabricating method includes following steps. First, a substrate is provided. A plurality of patterned first transparent conductive patterns and a plurality of patterned second transparent conductive patterns are then formed on the substrate. Next, a patterned first metal layer is formed to form a plurality of scan lines, wherein each scan line extends a gate on the corresponding first transparent conductive pattern and to form a connecting metal pattern between each two adjacent second transparent conductive patterns for connecting the two adjacent second transparent conductive patterns, so as to form a plurality of common lines parallel to the scan lines. Thereafter, a gate insulation layer is formed over the substrate. Besides, a patterned semiconductor layer is formed on the gate insulation layer to form a channel layer above each gate and a semiconductor pattern above each second transparent conductive pattern, wherein the semiconductor layer is patterned with the same mask as that for forming the first transparent conductive patterns and the second transparent conductive patterns. Moreover, a patterned second metal layer is formed to form a plurality of data lines intersecting with the scan lines and the connecting metal patterns and to form source and drain respectively at two sides of each channel layer, wherein each source is connected to the corresponding data line. After that, a patterned dielectric layer is formed over the substrate to cover the channel layers, the semiconductor patterns, and the data lines, the sources and drains, wherein the dielectric layer has a plurality of contact window openings for respectively exposing the drains. Next, a plurality of pixel electrodes are formed on the dielectric layer, and each pixel electrode is electrically connected to the corresponding drain via the corresponding contact window opening.

According to an embodiment of the present invention, the transparent conductive patterns may be fabricated with the same material as the material of the pixel electrodes.

According to an embodiment of the present invention, an ion doping process is further performed after or while forming the semiconductor layer so as to form an ohmic contact layer on the surface of the semiconductor layer.

According to an embodiment of the present invention, the step of forming the dielectric layer comprises sequentially forming a passivation layer and a planarization layer.

The present invention further provides a method of fabricating a TFT array substrate. The fabricating method includes following steps. First, a substrate is provided. A patterned transparent conductive layer is then formed on the substrate to form a plurality of transparent conductive patterns and a plurality of common lines. Next, a patterned first metal layer is formed to form a plurality of scan lines, wherein each scan line extends a gate on the corresponding transparent conductive pattern. Besides, a gate insulation layer is formed over the substrate. After that, a patterned semiconductor layer is formed on the gate insulation layer to form a channel layer above each gate and a semiconductor pattern above each common line, wherein the semiconductor layer may be patterned with the same mask as that for patterning the transparent conductive layer, for example. Moreover, a patterned second metal layer is formed to form a plurality of data lines intersecting with the scan lines and to form source and drain respectively at two sides of each channel layer, wherein each source is connected to the corresponding data line. Thereafter, a patterned dielectric layer is formed over the substrate to cover the channel layers, the semiconductor patterns, and the data lines, the sources and drains, wherein the dielectric layer has a plurality of contact window openings for respectively exposing the drains and separating two ends of the semiconductor pattern so as to form a floating semiconductor pattern. Next, a plurality of pixel electrodes is formed on the dielectric layer, wherein each pixel electrode is electrically connected to the corresponding drain via the corresponding contact window opening.

According to an embodiment of the present invention, the transparent conductive layer may be fabricated with the same material as that of the pixel electrodes.

According to an embodiment of the present invention, an ion doping process is further performed after or while forming the semiconductor layer, so as to form an ohmic contact layer on the surface of the semiconductor layer.

According to an embodiment of the present invention, the step of forming the dielectric layer includes sequentially forming a passivation layer and a planarization layer.

The present invention provides a TFT array substrate including a substrate, a plurality of scan lines, a plurality of data lines, a plurality of first transparent conductive patterns, a plurality of gates, a plurality of second transparent conductive patterns, a plurality of connecting metal patterns, a gate insulation layer, a plurality of channel layers, a plurality of semiconductor patterns, a plurality of sources and drains, a dielectric layer, and a plurality of pixel electrodes. The scan lines are disposed on the substrate. The first transparent conductive patterns are disposed on the substrate and are adjacent to their corresponding scan lines. The gates are disposed on the first transparent conductive patterns and are electrically connected to the corresponding scan lines. The second transparent conductive patterns are disposed on the substrate and are arranged in parallel to their corresponding scan lines. At least one of the connecting metal patterns is respectively disposed between two adjacent second transparent conductive patterns for connecting the two adjacent second transparent conductive patterns, so as to form a plurality of common lines parallel to the scan lines. The gate insulation layer covers the scan lines, the first transparent conductive patterns, the gates, the second transparent conductive patterns, and the connecting metal patterns. The channel layers are disposed on the gate insulation layer above the gates and are corresponding to the first transparent conductive patterns. The semiconductor patterns are corresponding to the second transparent conductive patterns and are disposed on the gate insulation layer above the second transparent conductive patterns. The sources and drains are respectively disposed at two sides of the channel layers. The data lines are disposed on the gate insulation layer and are electrically connected to the sources, and the data lines intersect with but are not electrically connected to the scan lines and the connecting metal patterns. The patterned dielectric layer is disposed over the channel layers, the semiconductor patterns, the data lines, the sources and drains, and the dielectric layer has a plurality of contact window openings for respectively exposing the drains. The pixel electrodes are disposed on the dielectric layer and each pixel electrode is electrically connected to the corresponding drain via the corresponding contact window opening.

According to an embodiment of the present invention, the material of the first transparent conductive patterns comprises indium tin oxide (ITO), indium zinc oxide (IZO), aluminum zinc oxide (AZO), or combinations thereof.

According to an embodiment of the present invention, the material of the channel layers and the semiconductor patterns comprises amorphous silicon.

According to an embodiment of the present invention, the material of the second transparent conductive patterns comprises ITO, IZO, AZO or combinations thereof.

According to an embodiment of the present invention, the TFT array substrate further comprises an ohmic contact layer disposed between each channel layer and the corresponding source and drain.

According to an embodiment of the present invention, the dielectric layer comprises a passivation layer and a planarization layer disposed on the passivation layer.

The present invention further provides a TFT array substrate including a substrate, a plurality of scan lines, a plurality of data lines, a plurality of transparent conductive patterns, a plurality of gates, a plurality of semiconductor patterns, a gate insulation layer, a plurality of channel layers, a plurality of common lines, a plurality of sources and drains, a patterned dielectric layer, and a plurality of pixel electrodes. The scan lines and the data lines are disposed on the substrate. The transparent conductive patterns are disposed on the substrate and are adjacent to their corresponding scan lines. The gates are disposed on the transparent conductive patterns and are connected to the corresponding scan lines. The common lines are disposed on the substrate and are parallel to the scan lines. The gate insulation layer covers the scan lines, the transparent conductive patterns, the common lines, and the gates. The data lines are disposed on the gate insulation layer and are electrically connected to the sources, and the data lines intersect with but are not electrically connected to the scan lines and the common lines. The channel layers are corresponding to the transparent conductive patterns and are disposed on the gate insulation layer above the gates. The semiconductor patterns are corresponding to the common lines and are disposed on the gate insulation layer above the common lines. The sources and drains are respectively disposed at two sides of the channel layers. The patterned dielectric layer is disposed over the channel layers, the semiconductor patterns, the data lines, the sources and drains, and the dielectric layer has a plurality of contact window openings for respectively exposing the drains. The pixel electrodes are disposed on the dielectric layer and each pixel electrode is electrically connected to the corresponding drain via the corresponding contact window opening.

According to an embodiment of the present invention, the transparent conductive patterns and the common lines are made of the same film.

According to an embodiment of the present invention, the material of the semiconductor layer includes amorphous silicon.

According to an embodiment of the present invention, the material of the transparent conductive patterns and the common lines includes indium tin oxide (ITO), indium zinc oxide (IZO), aluminum zinc oxide (AZO) or combinations thereof.

According to an embodiment of the present invention, the TFT array substrate further includes an ohmic contact layer disposed between each channel layer and the corresponding source and drain.

According to an embodiment of the present invention, the dielectric layer includes a passivation layer and a planarization layer disposed on the passivation layer.

According to the fabricating method of a TFT array substrate in an embodiment of the present invention, at least a part of each common line is fabricated with transparent conductive material to improve pixel aperture ratio, and the transparent conductive patterns for forming the common lines may be defined with the same mask as that for defining the semiconductor layer to reduce the required mask processes and further to reduce the fabricating cost. Moreover, in the present invention, the common lines on the TFT array substrate may also be formed by connecting the metal patterns and the transparent conductive patterns so that the common lines may have lower resistance, accordingly the power consumption of the TFT array substrate may be reduced and signal distortion may be avoided.

The present invention further provides a liquid crystal panel comprising the TFT array substrate according to the embodiments of the present invention, an opposite substrate and a liquid crystal layer disposed therebetween is provided. The opposite substrate may be a color filter or a substrate including another common electrode.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
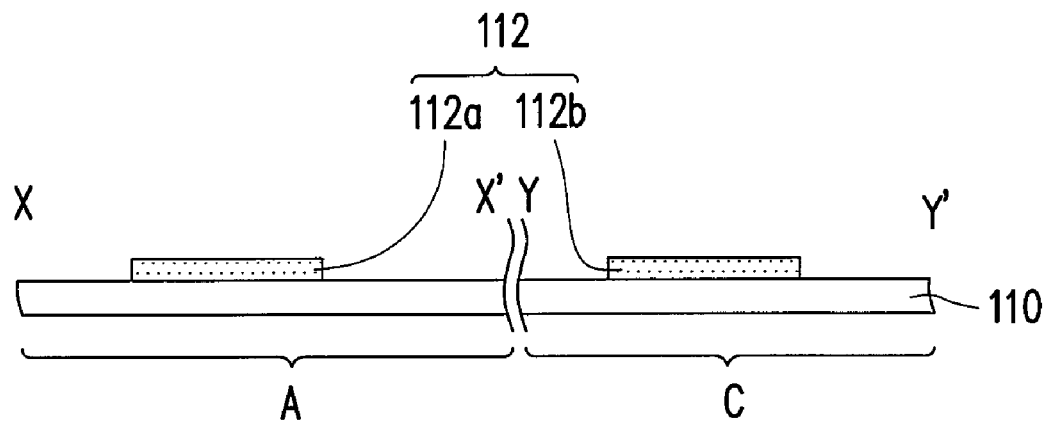
FIGS. 1A~1M are cross-sectional views illustrating the fabricating process of a thin film transistor (TFT) array substrate according to embodiments of the present invention.
Figure 1B:
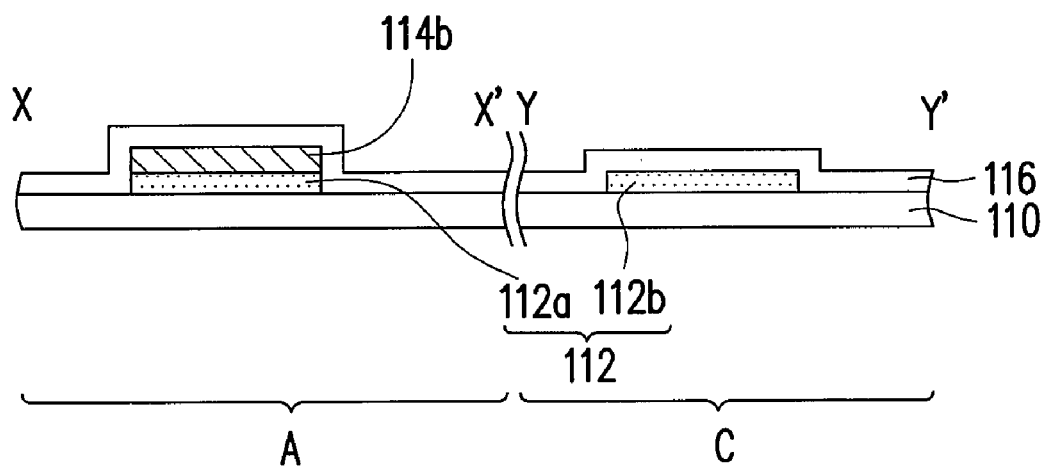
Figure 1C:
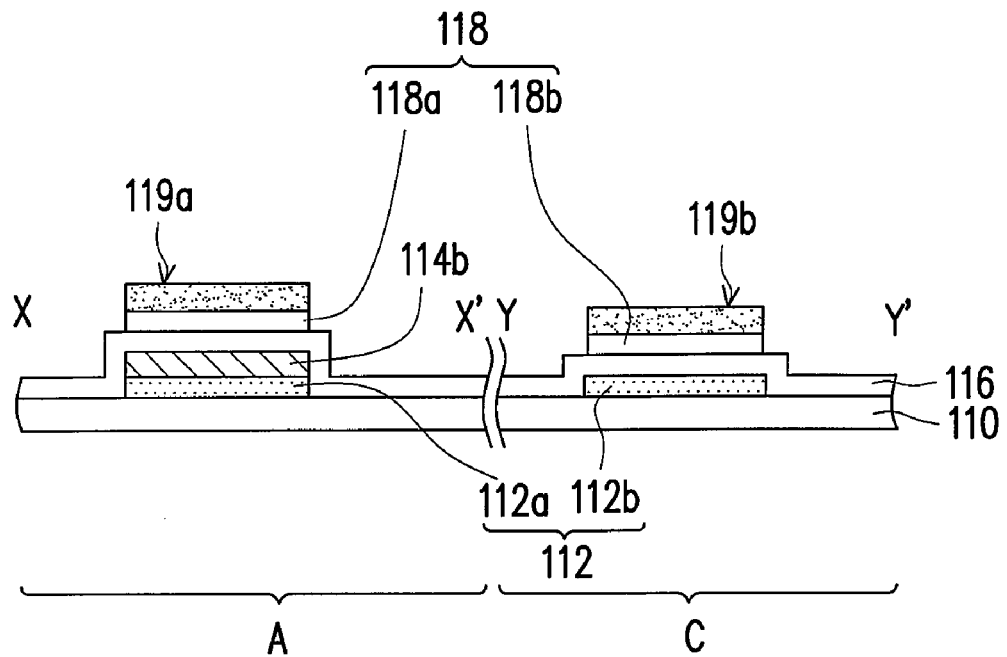
Figure 1D:
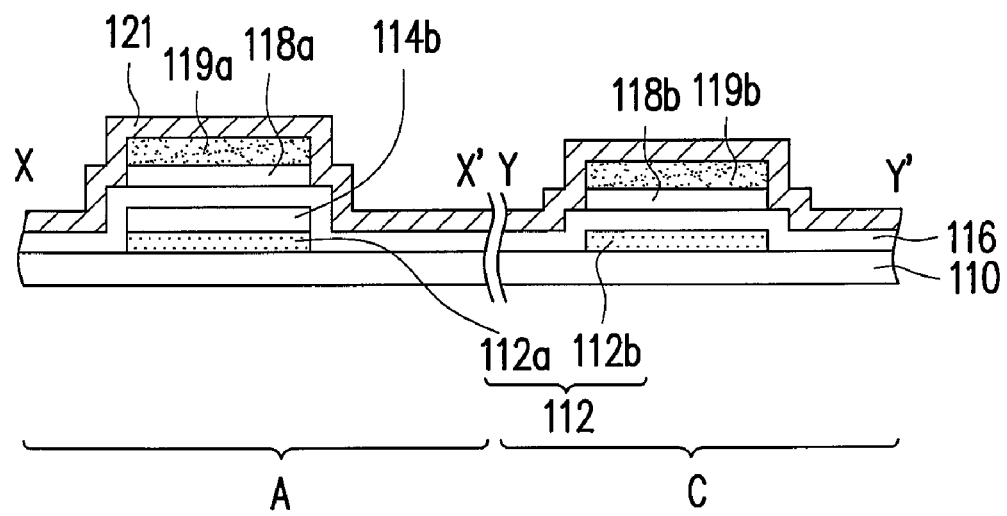
Figure 1E:
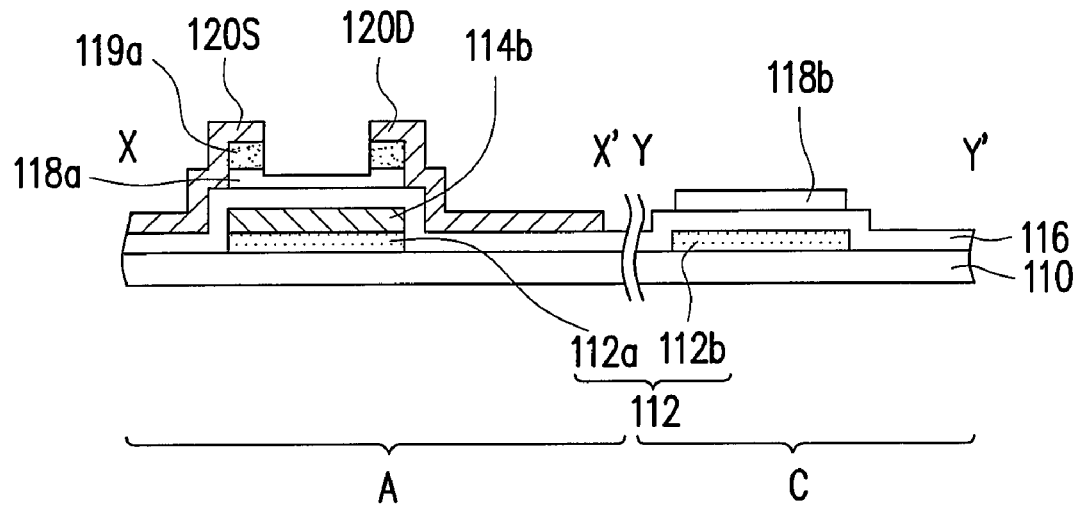
Figure 1F:
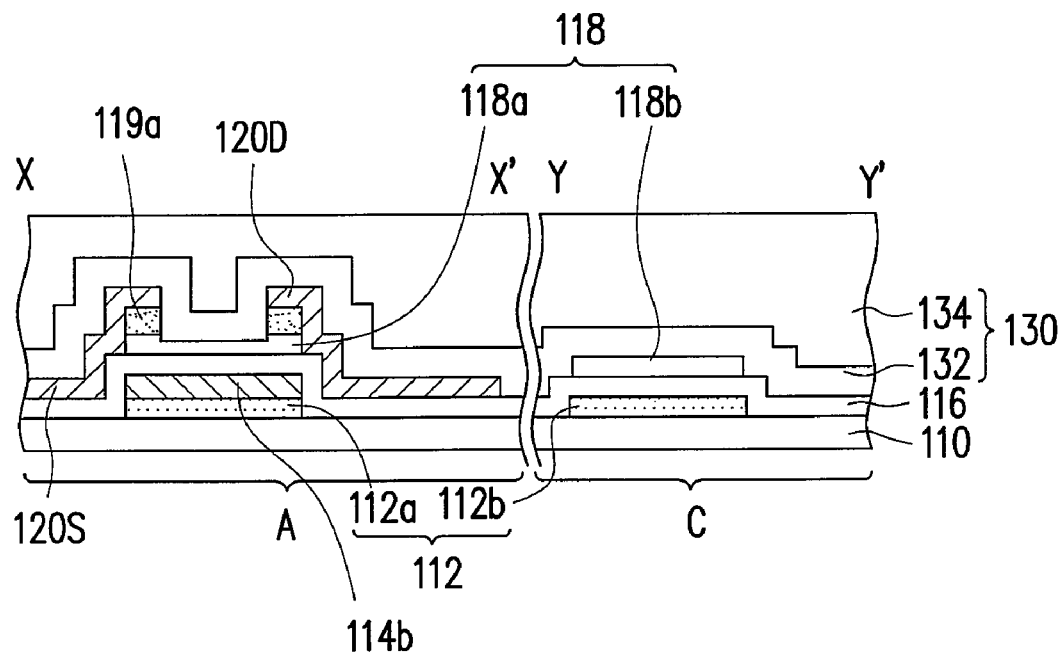
Figure 1G:
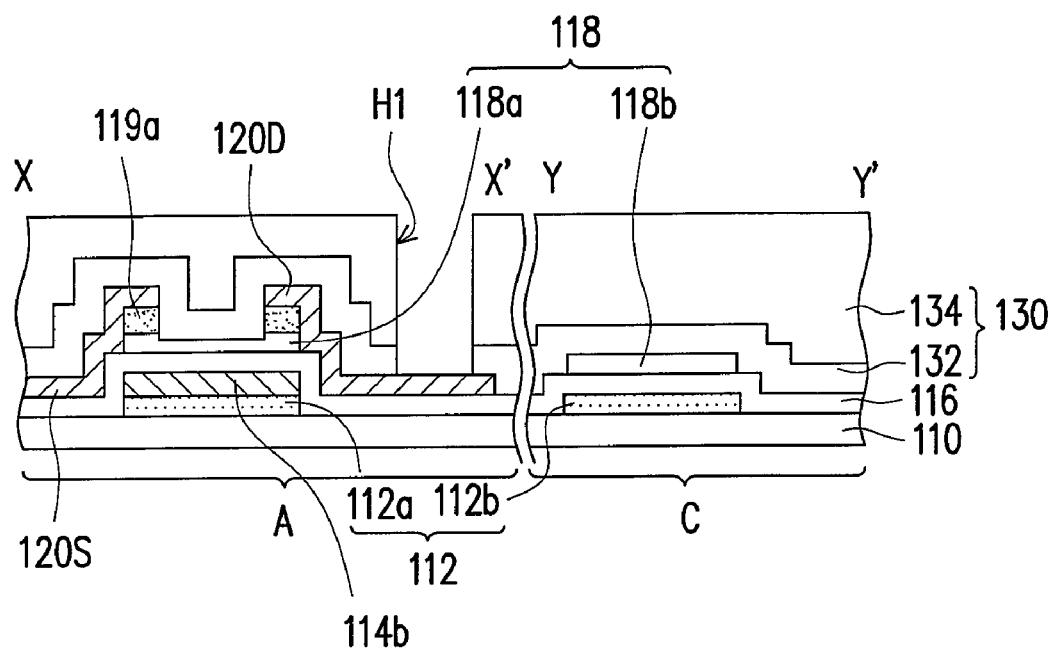
Figure 1H:
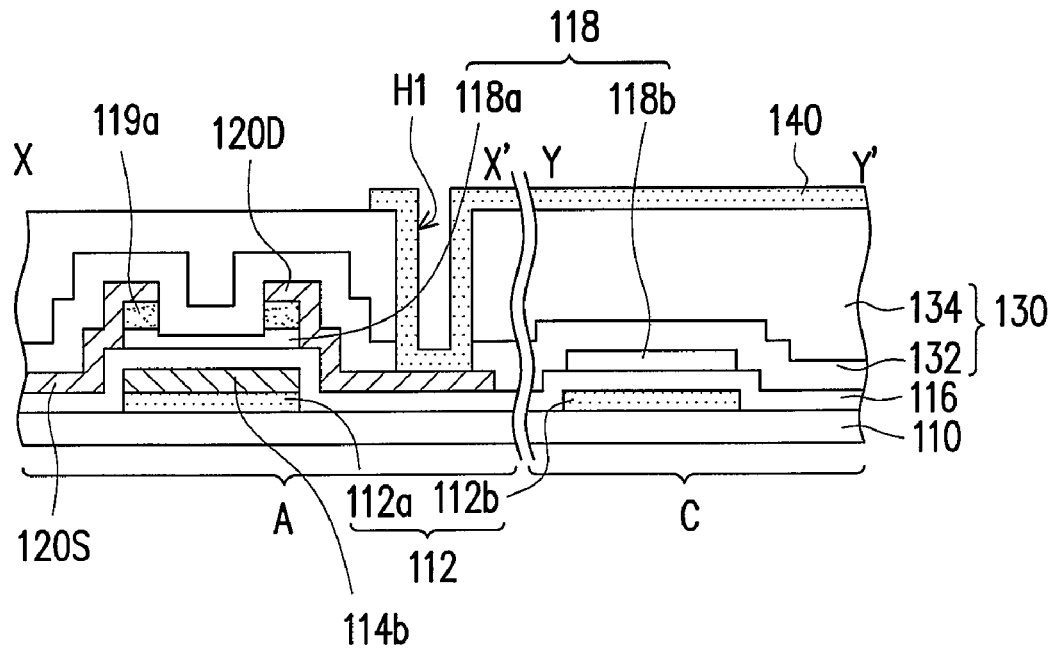
Figure 2A:
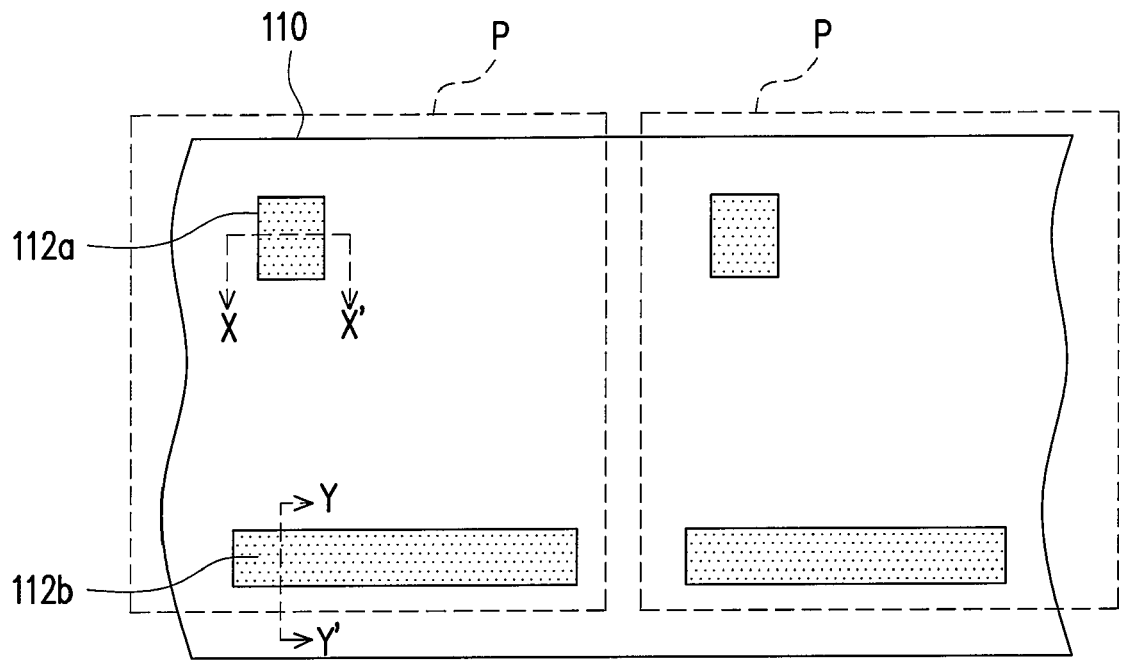
FIGS. 2A~2E are top views illustrating the fabricating process of the TFT array substrate according to the first embodiment of the present invention.

FIGS. 1A~1H are cross-sectional views illustrating the fabricating flow of a thin film transistor (TFT) array substrate according to a first embodiment of the present invention, and FIGS. 2A~2E are top views illustrating the fabricating flow of the TFT array substrate according to the first embodiment of the present invention. Referring to FIG. 1A and FIG. 2A, first, a substrate 110 is provided, and the substrate 110 has a plurality of pixel preset regions P arranged as an array (only two pixel preset regions P are illustrated demonstratively in FIG. 2A), and each pixel preset region P has an active device region A and a capacitor region C. A patterned transparent conductive layer 112 is then formed on the substrate 110 to form a first transparent conductive pattern 112a in each active device region A and a second transparent conductive pattern 112b in each capacitor region C.

To be specific, the transparent conductive layer 112 may be formed by depositing a transparent conductive material on the substrate 110 through chemical vapor deposition (CVD). A mask process is then performed to the deposited transparent conductive material to form the first transparent conductive pattern 112a and the second transparent conductive pattern 112b. The material of the transparent conductive layer 112 may be indium tin oxide (ITO), indium zinc oxide (IZO), aluminum zinc oxide (AZO) or combinations thereof.

Figure 2B:
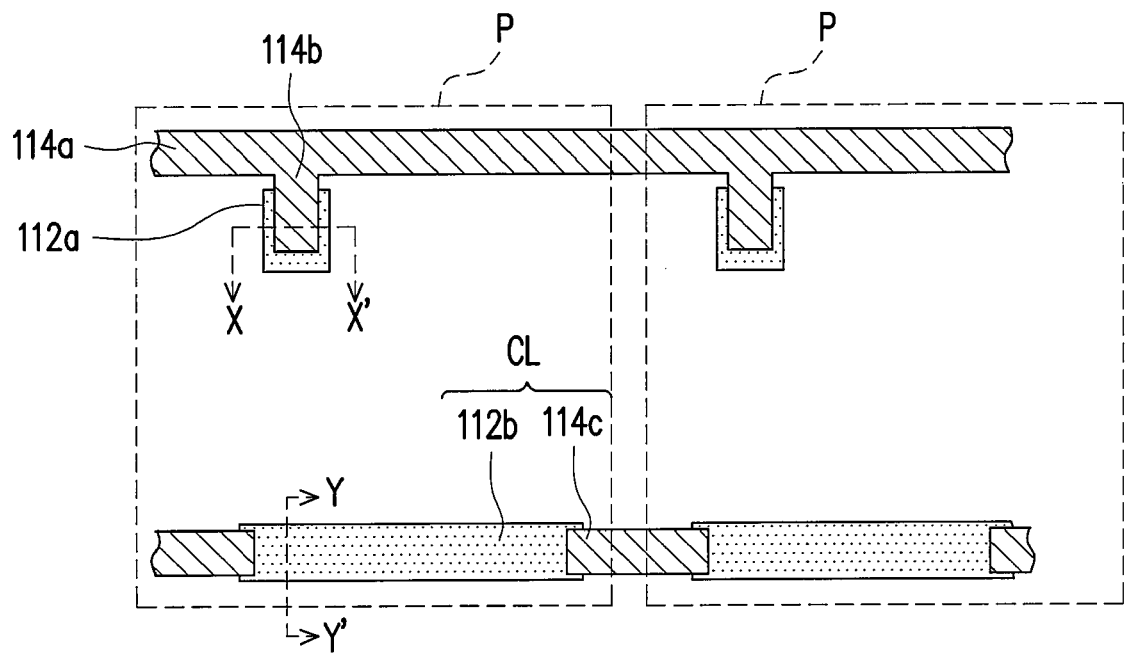

After that, referring to FIG. 1B and FIG. 2B, a patterned first metal layer is formed within the pixel preset regions P of the substrate 110 to form a plurality of scan lines 114a, wherein the scan line 114a in each pixel preset region P extends a gate 114b on the corresponding first transparent conductive pattern 112a, and to form a connecting pattern for connecting two adjacent second transparent conductive patterns 112b, for example to form a connecting metal pattern 114c between two adjacent second transparent conductive patterns 112b. To be specific, the first metal layer may be formed by depositing one or more metal materials over the substrate 110 through physics vapor deposition (PVD), and a mask process is then performed to pattern the metal material, so as to form the scan lines 114a, the gates 114b, and the connecting metal patterns 114c, simultaneously. The foregoing metal material may be a low resistance material such as aluminum, gold, copper, molybdenum, chromium, titanium, aluminum alloy, aluminum magnesium alloy, molybdenum alloy or combinations thereof.

It should be specified here that the connecting metal patterns 114c may connect the second transparent conductive patterns 112b in two adjacent pixel preset regions P, so as to form a plurality of common lines CL parallel to the scan lines 114a. It should be noted here that since some of the common lines CL in the present invention are fabricated with transparent conductive material, the aperture ratio of the pixel preset regions P is improved. Moreover, since the resistance of the connecting metal patterns 114c for connecting the second transparent conductive patterns 112b is lower than that of ITO, thus, the common lines CL fabricated with metal material in the present invention have both lower resistance and better conductivity. Next, a gate insulation layer 116 is formed over the substrate 110. The material of the gate insulation layer 116 may be SiN or SiO formed with TEOS (tetraethoxysilane) as a reactive gas source.

Figure 2C:
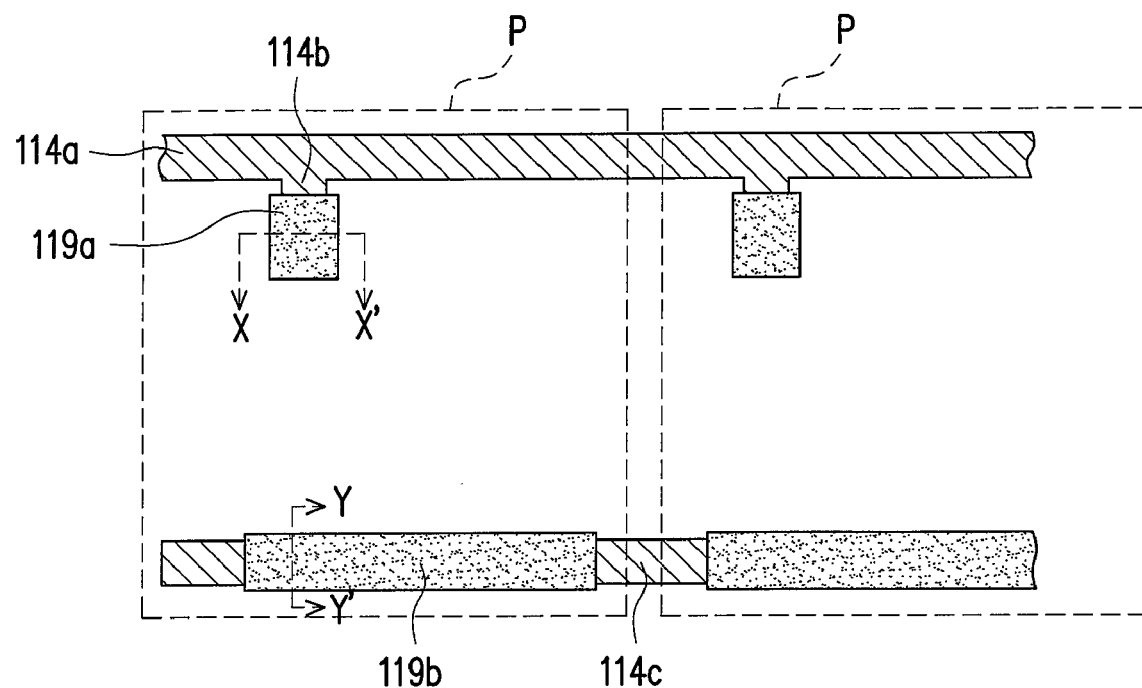
Figure 2D:
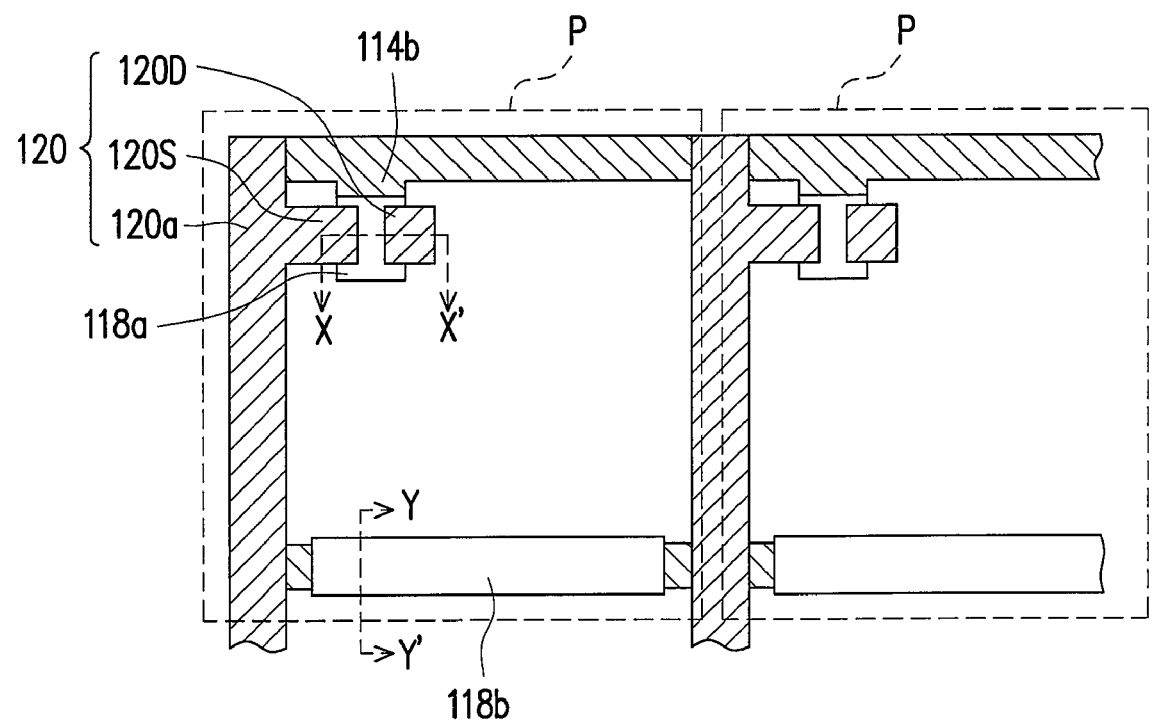

Next, referring to FIG. 1C and FIG. 2C, a patterned semiconductor layer 118 is formed on the gate insulation layer 116 to form a channel layer 118a above each gate 114b and a semiconductor pattern 118b above each second transparent conductive pattern 112b. Generally speaking, the semiconductor layer 118 may be formed by depositing amorphous silicon over the substrate 110 through CVD. A mask process is then performed to pattern the amorphous silicon deposited on the gate insulation layer 116, so as to form the channel layers 118a and the semiconductor patterns 118b.

To reduce the contact resistance between the channel layers 118a and the metal material, actually an ion doping process may be further performed to form an ohmic contact layer 119a and a doped semiconductor layer 119b on the surface of the semiconductor layer 118 after or while forming the semiconductor layer 118. It should be noted here that the semiconductor layer 118 is patterned with the same mask as that for patterning the transparent conductive layer 112 which includes the first transparent conductive patterns 112a and the second transparent conductive patterns 112b.

In the present invention, the common lines CL are composed of the second transparent conductive patterns 112b and the connecting metal patterns 114c, wherein the second transparent conductive patterns 112b are patterned with the same mask as that for patterning the semiconductor layer 118, and the connecting metal patterns 114c, the scan lines 114a, and the gates 114b are formed through the same mask process. Thus, compared to conventional technique, an additional mask for defining the common lines CL is not required in the present invention, accordingly, the fabricating cost is reduced.

Next, referring to FIG. 1D, a metal material 121 is formed over the substrate 110 to cover parts of the gate insulation layer 116, the ohmic contact layer 119a, and the doped semiconductor layer 119b. After that, referring to FIG. 1E and FIG. 2D, portion of the metal material 121 is removed and the metal material 121 is patterned to form a patterned second metal layer 120 and further to form a plurality of data lines 120a intersecting with the scan lines 114a and a source 120S and a drain 120D at two sides of each channel layer 118a. Furthermore, the doped semiconductor layer 119b above the second transparent conductive patterns 112b is also removed while the portion of the metal material 121 is removed. Each source 120S is connected to the corresponding data line 120a. The data lines 120a intersect with the common lines CL where the connecting metal patterns 114c are located.

In another embodiment of the present invention, the aforementioned step of FIG. 1D may be replaced by a backward exposure process to form the structure as shown in FIG. 1E. Specifically, referring to FIG. 1I, a photoresist layer R1 is formed to cover the ohmic contact layer 119a, the doped semiconductor layer 119b, and the gate insulation layer 116, wherein the photoresist layer R1 may be made of a positive-type photoresist. Then, as shown in FIG. 1J, a backward exposure is conducted to the photoresist layer R1 by using the gates 114b as a mask. If the gates 114 are made of opaque metal material, regions of the photoresist layer R1 above the gates 114b are not exposed. Next, referring to FIG. 1K, the photoresist layer R1 is developed, and the unexposed regions of the photoresist layer R1 are remained. Thereafter, as shown in FIG. 1L, the remained photoresist layer R1 above the gates 114b is used as a mask to remove the doped semiconductor layer 119b above the second transparent conductive patterns 112b. The doped semiconductor layer 119b may be removed through dry etching, for example, oxygen or a $CF_x$ based gas is used as a reactive gas source and a bias is supplied to the reactive gas source to form plasma, and an anisotropic etching is performed to the doped semiconductor layer 119b with the plasma. Then, the remained photoresist layer R1 is removed. Next, referring to FIG. 1M, a metal material 121 is formed over the substrate 110 to cover parts of the gate insulation layer 116, the ohmic contact layer 119a, and the semiconductor pattern 118b. Then, similarly, the metal material 121 is patterned to form a patterned second metal layer 120 and further to form a plurality of data lines 120a intersecting with the scan lines 114a and a source 120S and a drain 120D at two sides of each channel layer 118a, as shown in FIG. 1E.

After the step of FIG. 1E, a patterned dielectric layer 130 is formed over the substrate 110 as shown in FIG. 1F. To be specific, the step of forming the dielectric layer 130 may include sequentially forming a passivation layer 132 and a planarization layer 134. The material of the passivation layer 132 may be silicon oxide, silicon nitride, or silicon oxynitride, and the material of the planarization layer 134 may be polyimide or organic material. Referring to FIG. 1G, contact window openings H1 are then formed in the dielectric layer 130 for exposing the drains 120D.

Figure 1I:
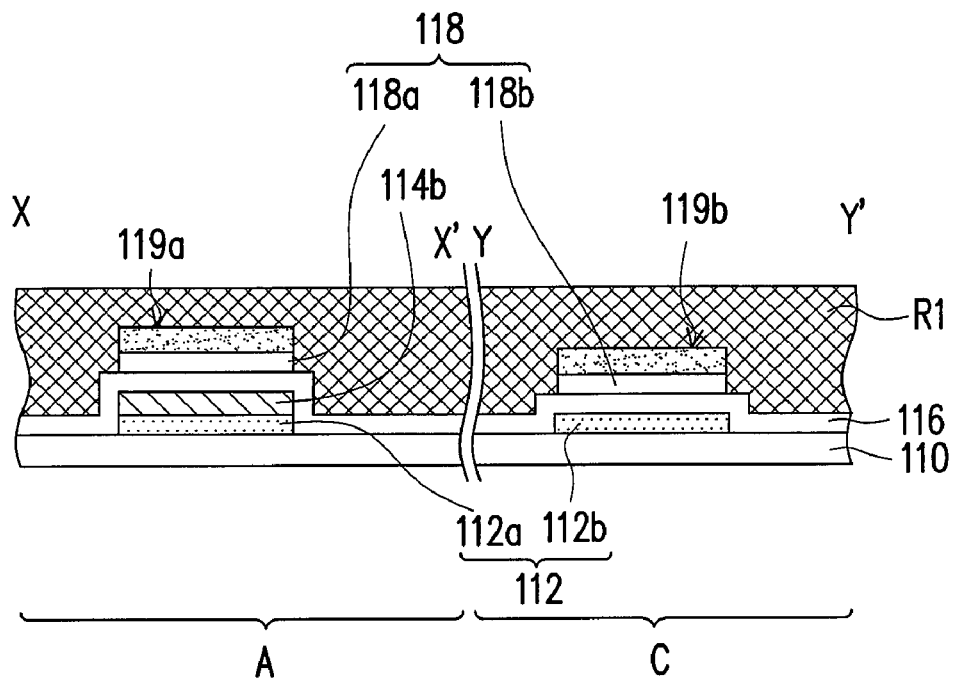
Figure 1J:
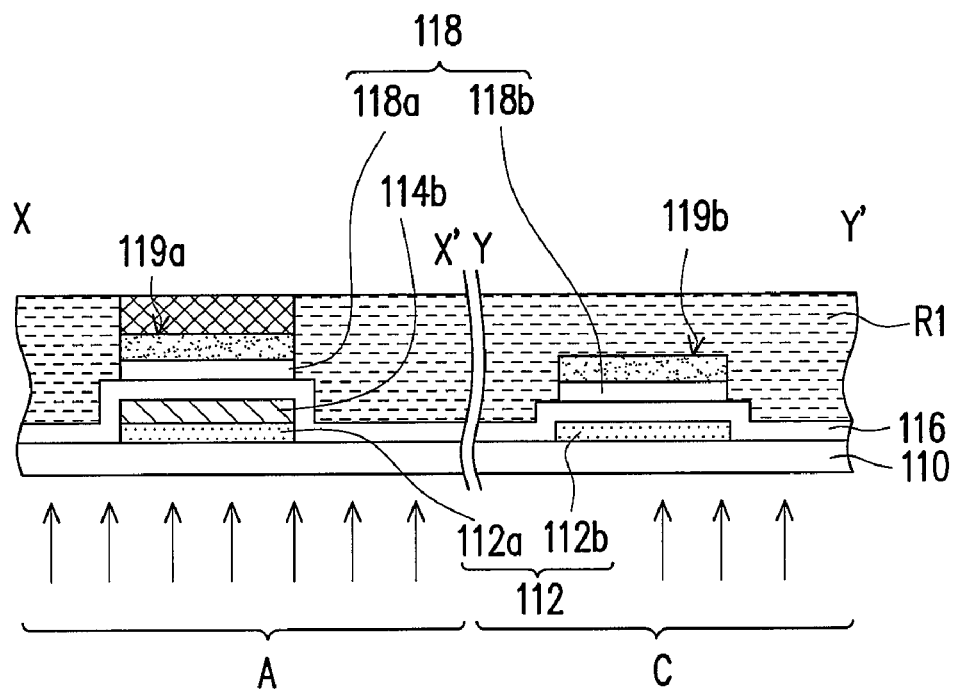
Figure 1K:
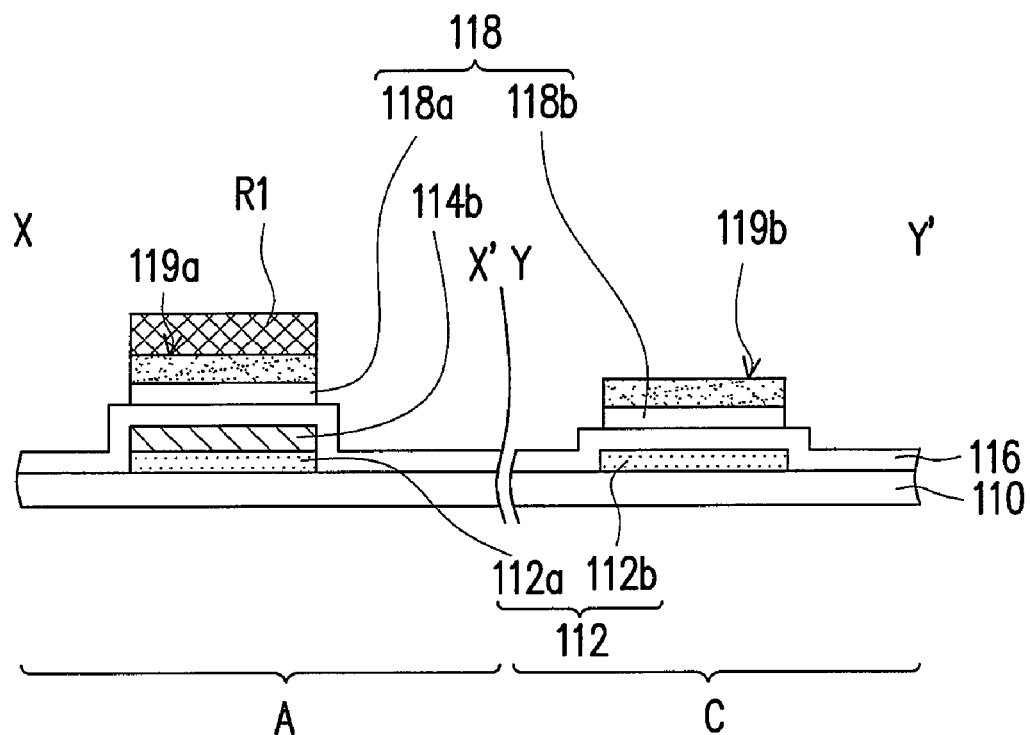
Figure 1L:
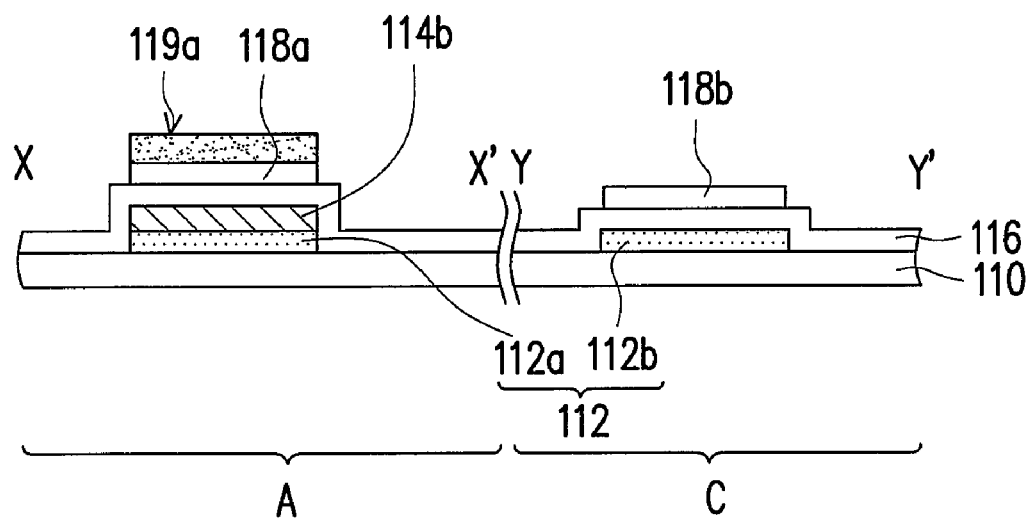
Figure 1M:
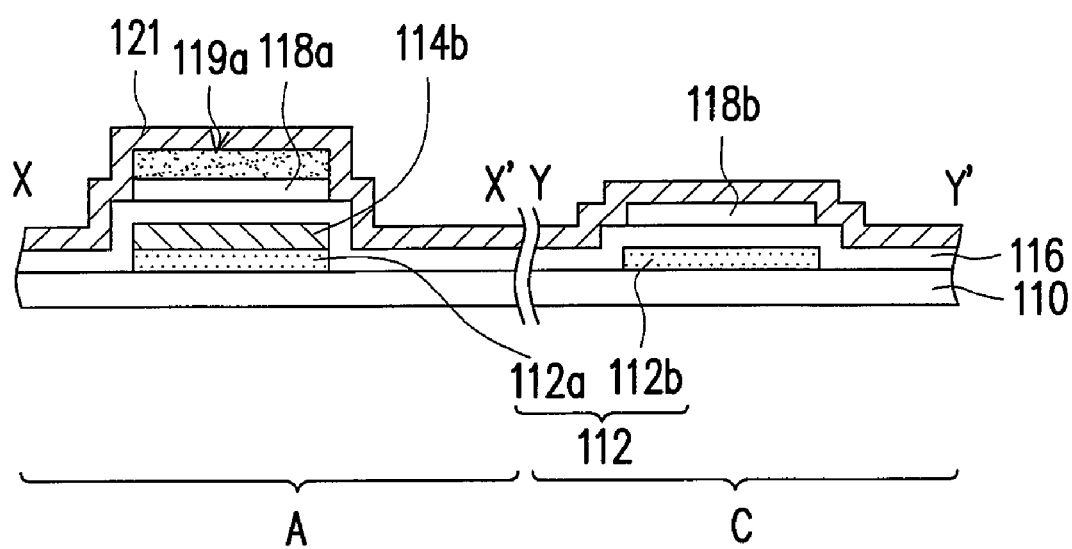
Figure 2E:
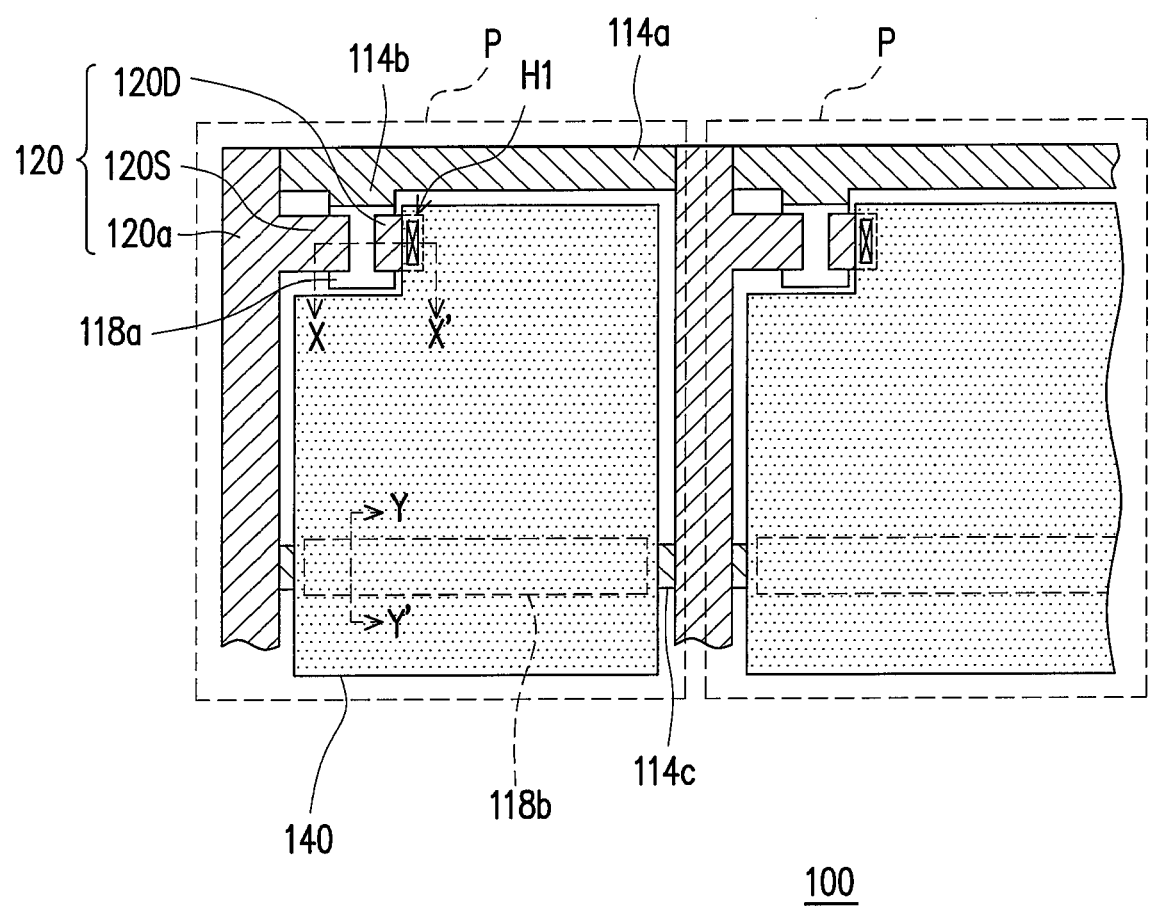

Next, referring to FIG. 1H and FIG. 2E, pixel electrodes 140 are formed on the dielectric layer 130. To be specific, first, a transparent electrode material is deposited on the dielectric layer 130 and the transparent electrode material is filled into the contact window openings H1. The transparent electrode material may be the same material as that of the transparent conductive layer 112. Next, a mask process is performed to the transparent electrode material to define a pixel electrodes 140 in each pixel preset region P, and the pixel electrode 140 is electrically connected to the corresponding drain 120D via the corresponding contact window opening H1. The common lines CL, which includes the second transparent conductive patterns 112b and the connecting metal patterns 114c, and the pixel electrodes 140 over the common lines CL form storage capacitors. As described above, the TFT array substrate 100 in the present invention has been completed. The common lines CL of the TFT array substrate 100 have low resistance; accordingly, the TFT array substrate 100 in the present invention has low power consumption.

The TFT array substrate 100 fabricated with foregoing method is illustrated in FIG. 1H and FIG. 2E, which includes a substrate 110, scan lines 114a, data lines 120a, first transparent conductive patterns 112a, second transparent conductive patterns 112b, connecting metal patterns 114c, gates 114b, sources 120S, drains 120D, a gate insulation layer 116, channel layers 118a, semiconductor patterns 118b, a dielectric layer 130, and pixel electrodes 140. The scan lines 114a and the data lines 120a are disposed on the substrate 110 to form a plurality of pixel preset regions P on the substrate 110, and each pixel preset region P contains an active device region A and a capacitor region C.

The first transparent conductive patterns 112a are disposed in the corresponding active device regions A. The gates 114b are disposed on the first transparent conductive patterns 112a, and are electrically connected to the corresponding scan lines 114a. The second transparent conductive patterns 112b are disposed in the corresponding capacitor regions C. At least one of the connecting metal patterns 114c is respectively disposed between two adjacent second transparent conductive patterns 112b. The connecting metal patterns 114c may connect the second transparent conductive patterns 112b in adjacent pixel preset regions P to form the common lines CL which are parallel to the scan lines 114a.

The gate insulation layer 116 covers the scan lines 114a, the first transparent conductive patterns 112a, the second transparent conductive patterns 112b, the gates 114b, and the connecting metal patterns 114c. The channel layers 118a are corresponding to the first transparent conductive patterns 112a and are disposed on the gate insulation layer 116 above the gates 114b. The semiconductor patterns 118b are corresponding to the second transparent conductive patterns 112b and are disposed on the gate insulation layer 116 above the second transparent conductive patterns 112b. AS shown in FIG. 1H, the sources 120S and the drains 120D are respectively disposed at two sides of the channel layers 118a. The dielectric layer 130 may include a passivation layer 132 and a planarization layer 134 disposed on the passivation layer 132. The dielectric layer 130 covers the channel layers 118a, the semiconductor patterns 118b, the ohmic contact layer 119a, the data lines 120a, the sources 120S, and the drains 120D. The pixel electrode 140 are formed on the dielectric layer 130 and electrically connected to the corresponding drain 120D via the corresponding contact window opening H1 to complete a TFT. Furthermore, the pixel electrodes 140 and the corresponding common lines CL form storage capacitors.

Second Embodiment

Figure 3A:
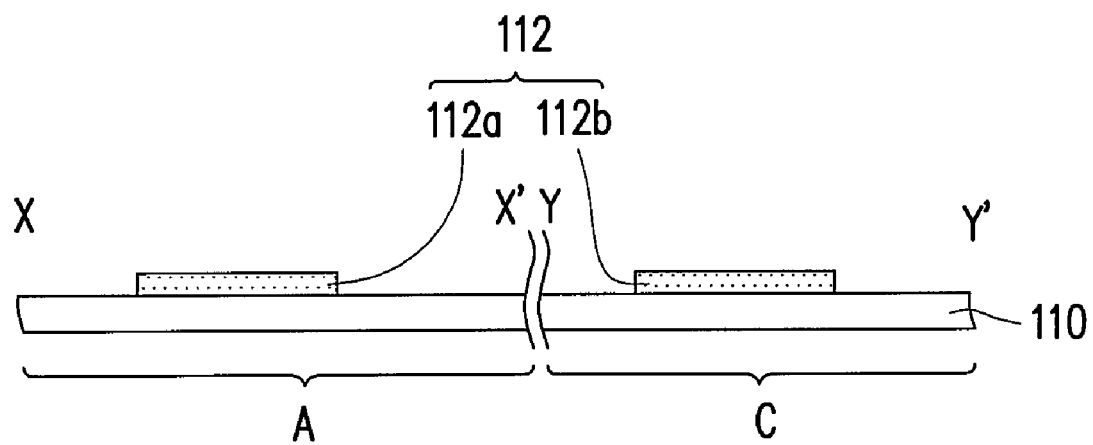
FIGS. 3A~3M are cross-sectional views illustrating the fabricating process of another TFT array substrate according to embodiments of the present invention.
Figure 3B:
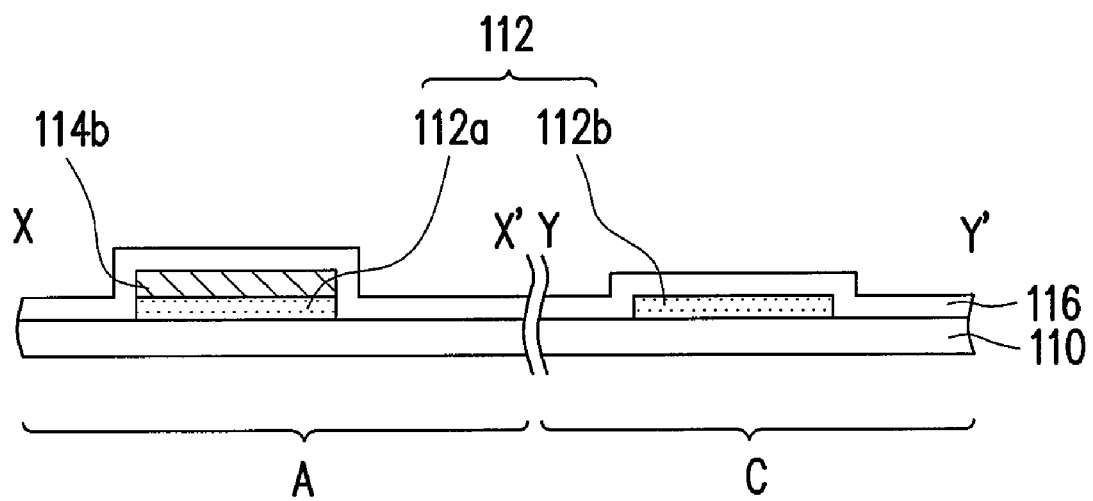
Figure 3C:
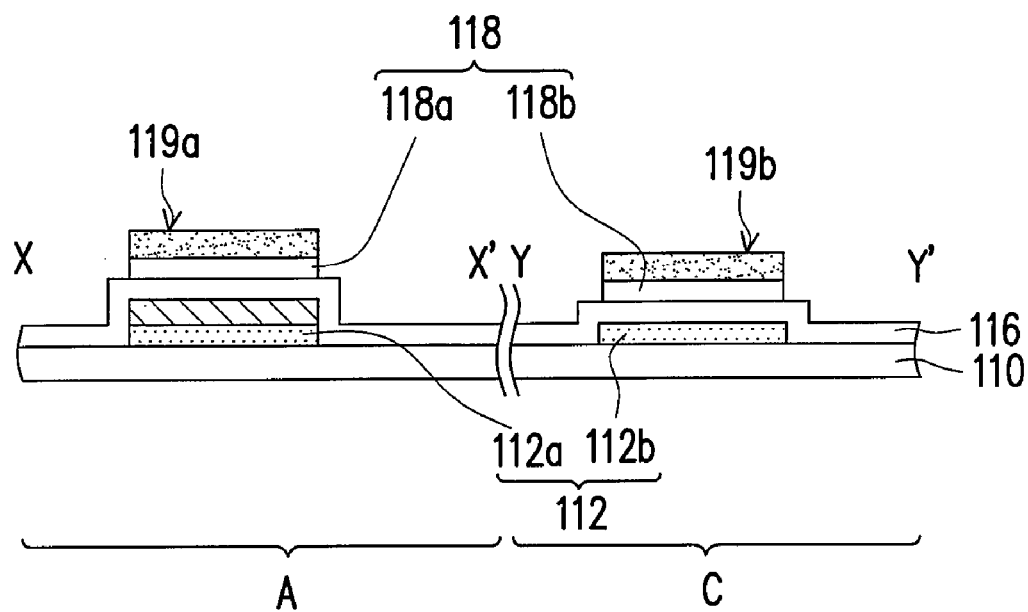
Figure 3D:
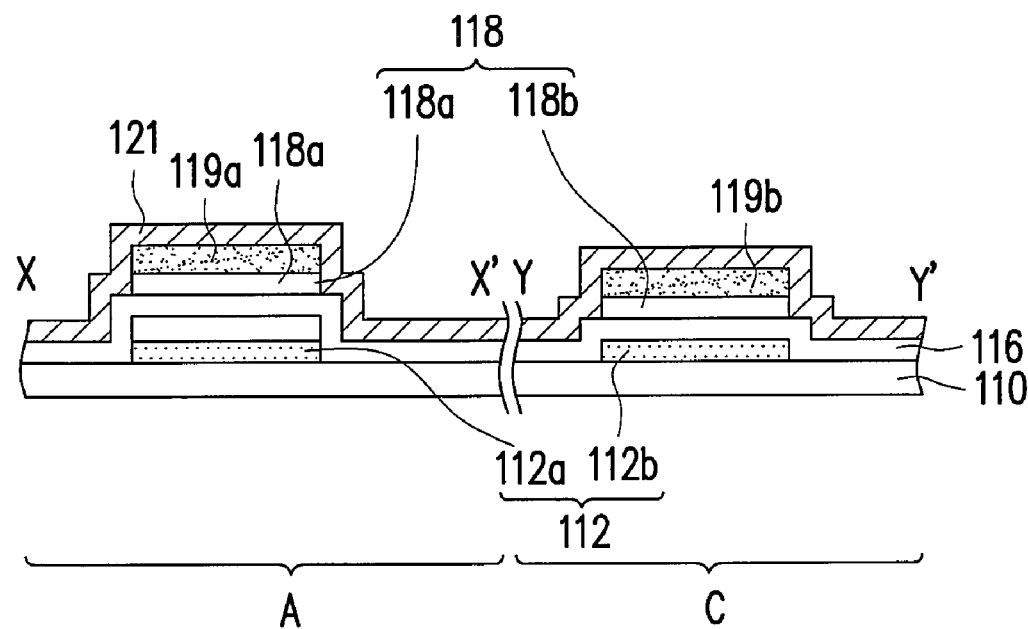
Figure 3E:
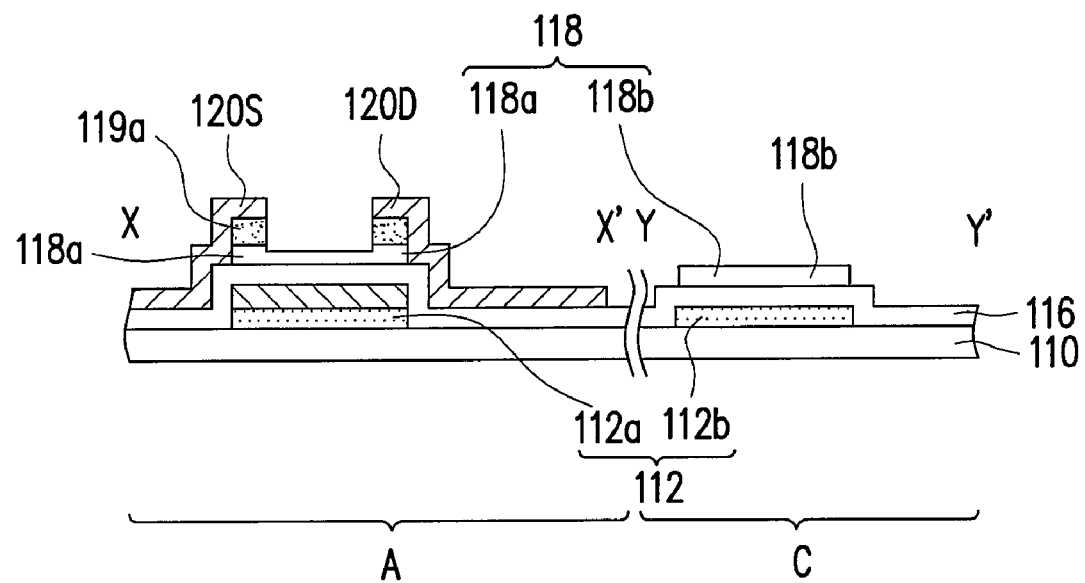
Figure 3F:
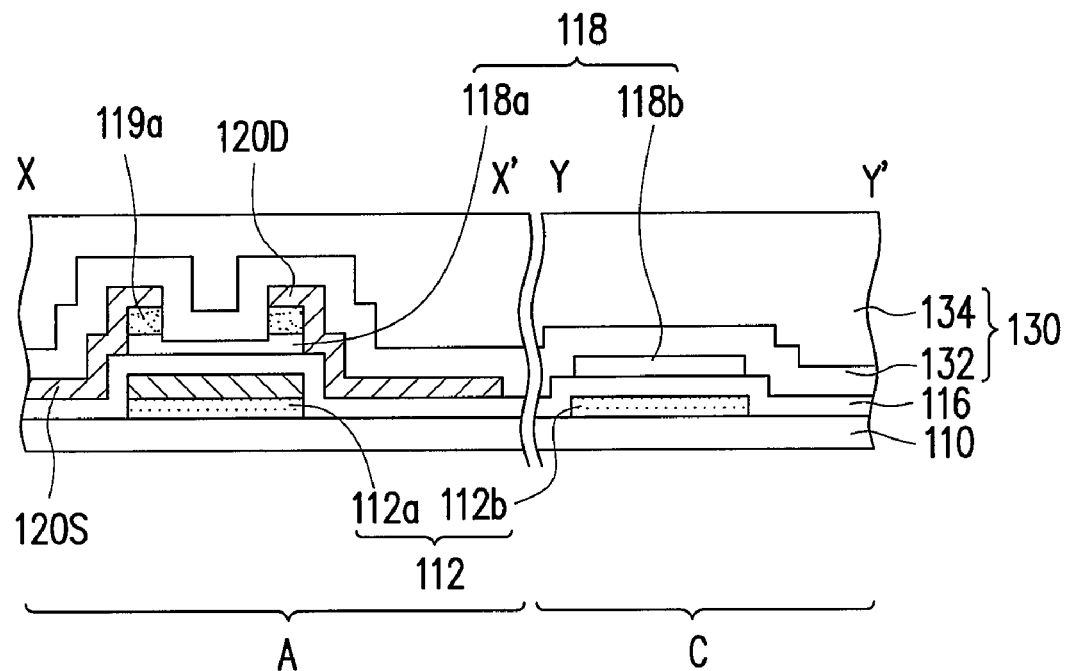
Figure 3G:
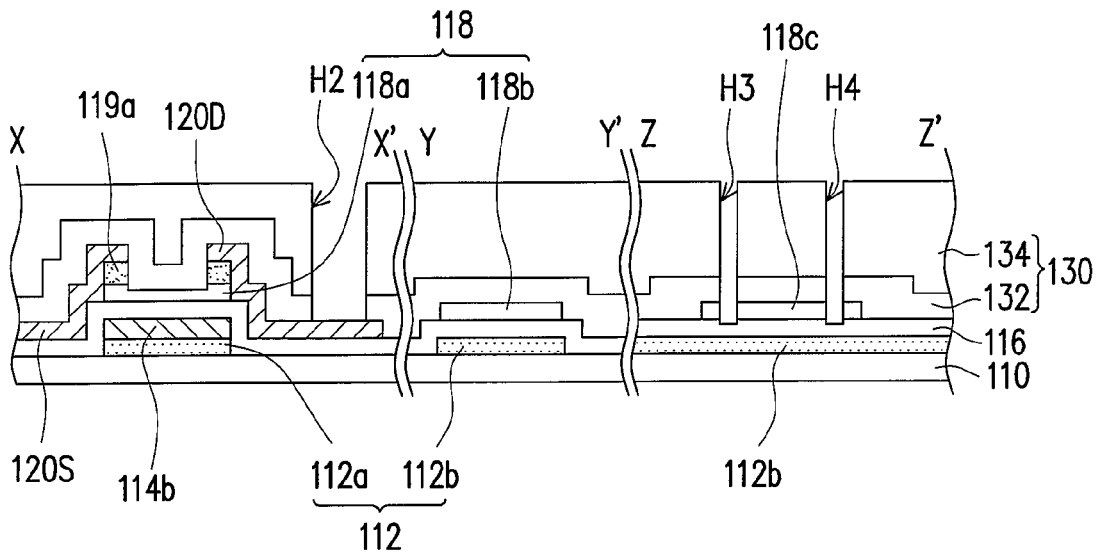
Figure 3H:
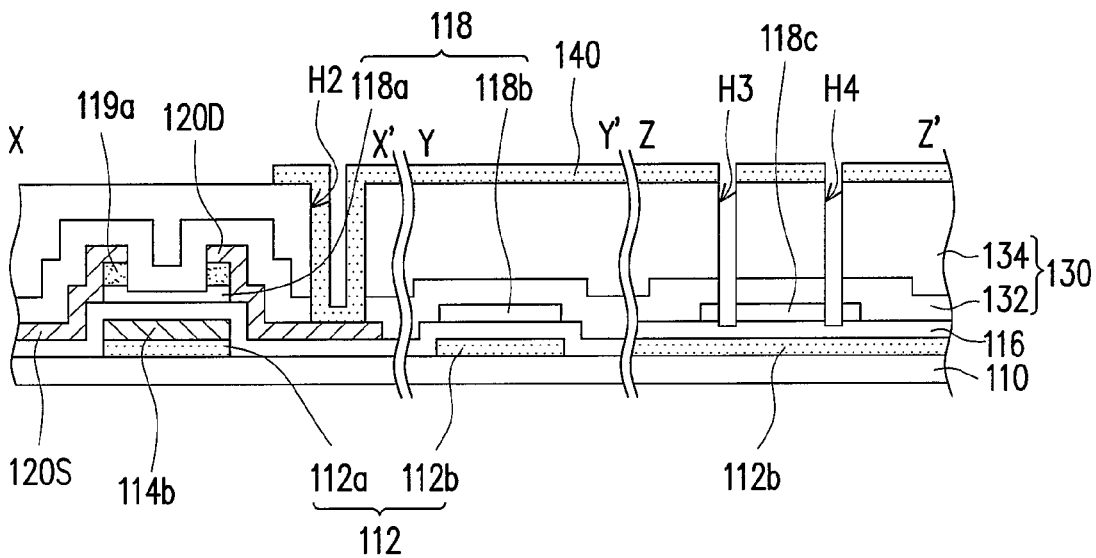
Figure 4A:
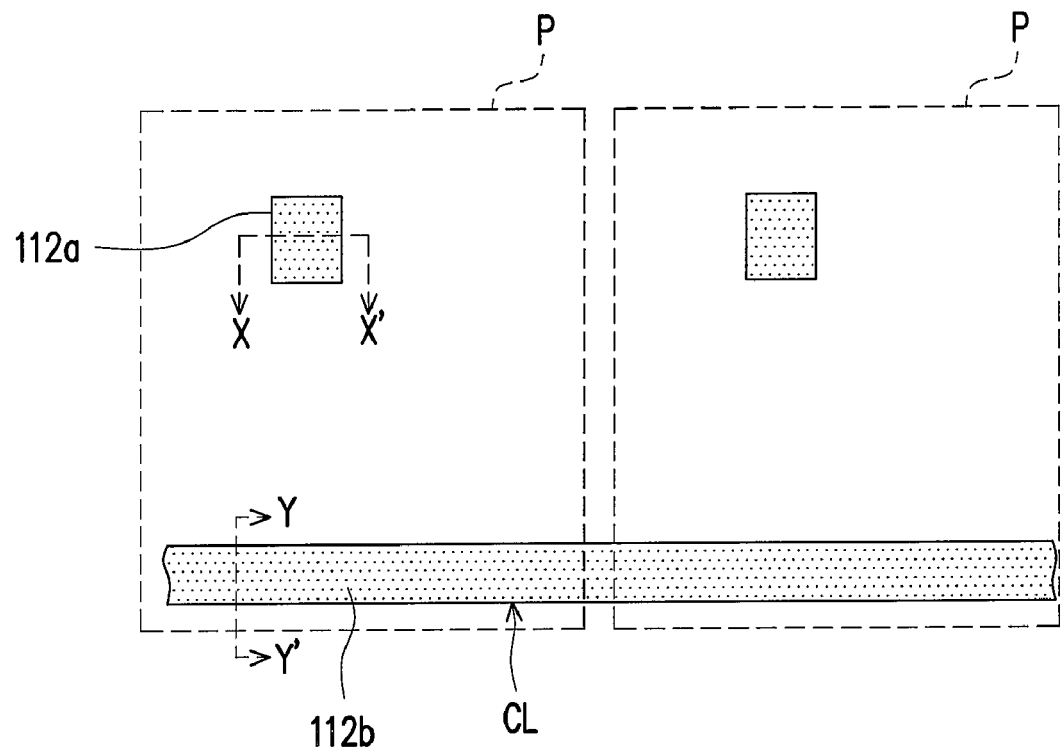
FIGS. 4A~4F are top views illustrating the fabricating process of the TFT array substrate according to the second embodiment of the present invention.

FIGS. 3A~3H are cross-sectional views illustrating the fabricating flow of a TFT array substrate according to a second embodiment of the present invention, and FIGS. 4A~4F are top views illustrating the fabricating flow of the TFT array substrate according to the second embodiment of the present invention. Referring to FIG. 3A and FIG. 4A, a substrate 110 is first provided and the substrate 110 has a plurality of pixel preset regions P arranged as an array (only two pixel preset regions P are illustrated demonstratively in FIG. 4A). Each of the pixel preset regions P has an active device region A and a capacitor region C. A patterned transparent conductive layer 112 is then formed on the substrate 110 to form a first transparent conductive pattern 112a in each active device region A and a second transparent conductive pattern 112b in each capacitor region C. It should be noted here that the second transparent conductive patterns 112b in adjacent pixel preset regions P are connected to each other to form the common lines CL on the substrate 110. In other words, in two or more adjacent preset regions P, the second transparent conductive patterns 112b are disposed continuously and formed into one piece or one single layer on the substrate 110.

To be specific, the transparent conductive layer 112 may be formed by depositing transparent conductive material on the substrate 110 through CVD. A mask process is then performed to the deposited transparent conductive material to form the first transparent conductive patterns 112a and the second transparent conductive patterns 112b thereby the common lines CL are formed. The material of the transparent conductive layer 112 may be ITO, IZO, AZO or combinations thereof.

Figure 4B:
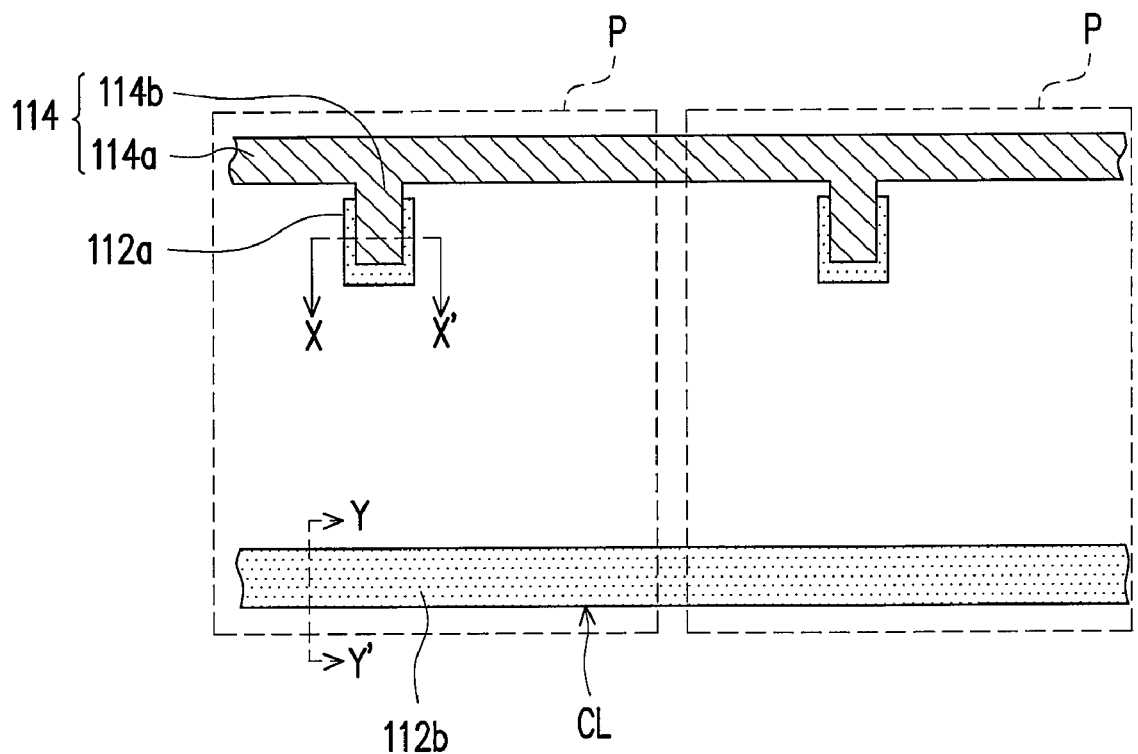

Referring to FIG. 3B and FIG. 4B, a patterned first metal layer 114 is formed over the substrate 110 to form a plurality of scan lines 114a and gates 114b. The scan line 114a in each pixel preset region P extends the gate 114b on the corresponding first transparent conductive pattern 112a. To be specific, the first metal layer 114 may be formed by depositing one or more metal materials over the substrate 110 through PVD, and a mask process is then performed to pattern the metal material for example, so as to form the scan lines 114a and the gates 114b. Next, a gate insulation layer 116 is formed over the substrate 110. The material of the gate insulation layer 116 may be SiN or SiO formed with TEOS as a reactive gas source.

Figure 4C:
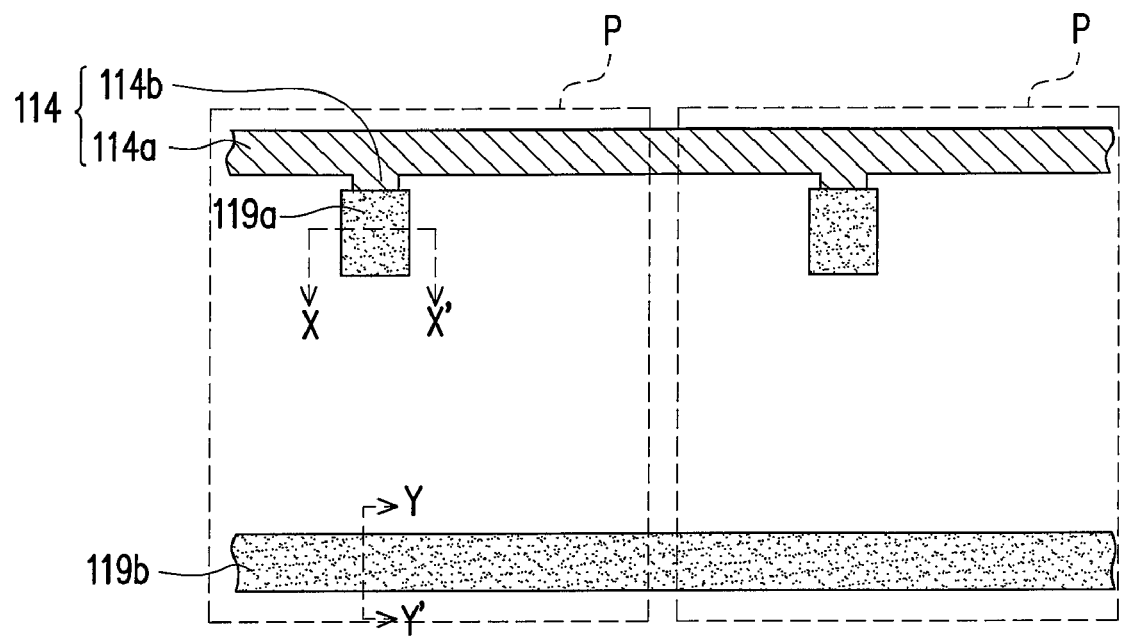
Figure 4D:
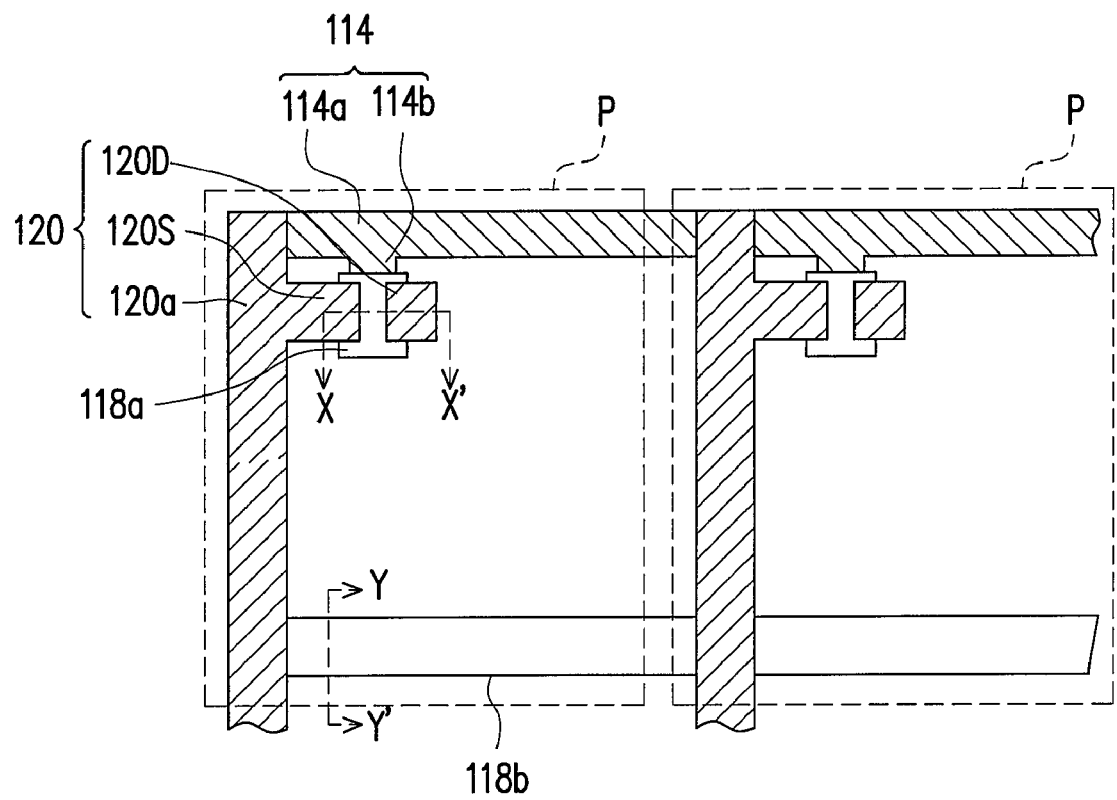

Thereafter, referring to FIG. 3C and FIG. 4C, a patterned semiconductor layer 118 is formed on the gate insulation layer 116 to form a channel layer 118a above each gate 114b and a semiconductor pattern 118b above each second transparent conductive pattern 112b. Generally speaking, the semiconductor layer 118 may be formed by depositing amorphous silicon over the substrate 110 through CVD. A mask process is then performed to pattern the amorphous silicon deposited on the gate insulation layer 116, so as to form the channel layers 118a and the semiconductor patterns 118b.

To reduce the contact resistance between the channel layers 118a and the metal material which may be formed for a source or a drain of a TFT, actually an ion doping process may be further performed to form an ohmic contact layer 119a and a doped semiconductor layer 119b on the surface of the semiconductor layer 118 after or while forming the semiconductor layer 118. It should be emphasized here that the semiconductor layer 118 may be patterned with the same mask as that for patterning the transparent conductive layer 112 including the first transparent conductive patterns 112a and the second transparent conductive patterns 112b. Thus, compared to conventional technique, an additional mask for defining the common lines CL is not required in the present invention so that the fabricating cost is reduced. Moreover, since the common lines CL in the present invention are fabricated with transparent conductive material, the aperture ratio of the pixel preset regions P is improved.

After that, referring to FIG. 3D, a metal material 121 is formed over the substrate 110 to cover parts of the gate insulation layer 116, the doped semiconductor layer 119b, and the ohmic contact layer 119a. Next, referring to FIG. 3E and FIG. 4D, the metal material 121 is patterned to form a patterned second metal layer 120 and further to form a plurality of data lines 120a which intersect with the scan lines 114a and a source 120S and a drain 120D respectively disposed at two sides of each channel layer 118a. Furthermore, the doped semiconductor layer 119b above the second transparent conductive patterns 112b may be also removed while the portion of the metal material 121 is removed. Each source 120S is connected to the corresponding data line 120a.

In another embodiment of the present invention, the aforementioned step of FIG. 3D may be replaced by a backward exposure process to form the structure as shown in FIG. 3E. Specifically, referring to FIG. 3I, a photoresist layer R2 is formed to cover the ohmic contact layer 119a, the doped semiconductor layer 119b, and the gate insulation layer 116, wherein the photoresist layer R2 may be made of a positive-type photoresist. Then, as shown in FIG. 3J, a backward exposure is conducted to the photoresist layer R2 by using the gates 114b as a mask. If the gates 114 are made of opaque metal material, regions of the photoresist layer R2 above the gates 114b are not exposed. Next, referring to FIG. 3K, a portion of the photoresist layer R2 is developed, and the unexposed regions of the photoresist layer R2 are remained. Thereafter, the remained photoresist layer R2 above the gates 114b is used as a mask to remove the doped semiconductor layer 119b above the second transparent conductive patterns 112b to expose the semiconductor pattern 118b. The doped semiconductor layer 119b may be removed through dry etching, for example, oxygen or a $CF_x$ based gas is used as a reactive gas source and a bias is supplied to the reactive gas source to form plasma, and an anisotropic etching is performed to the doped semiconductor layer 119b with the plasma. Then, the remained photoresist layer R2 is removed, as shown in FIG. 3L. Next, referring to FIG. 3M, a metal material 121 is formed over the substrate 110 to cover parts of the gate insulation layer 116, the ohmic contact layer 119a, and the semiconductor pattern 118b. Then, similarly, the metal material 121 is patterned to form a patterned second metal layer 120 and further to form a plurality of data lines 120a intersecting with the scan lines 114a and a source 120S and a drain 120D respectively disposed at two sides of each channel layer 118a, as shown in FIG. 3E.

After the step of FIG. 3E, a dielectric layer 130 is formed over the substrate 110 as shown in FIG. 3F. To be specific, the step of forming the dielectric layer 130 may include sequentially forming a passivation layer 132 and a planarization layer 134. The material of the passivation layer 132 may be silicon oxide, silicon nitride, or silicon oxynitride, and the material of the planarization layer 134 may be polyimide or organic material. Next, referring to FIG. 3G and FIG. 4E, contact window openings H2 are formed in the dielectric layer 130 for exposing the drains 120D. Moreover, slits H3 and H4 are formed in the dielectric layer 130 and through the semiconductor pattern 118b for separating two ends of each semiconductor patterns 118b, so as to form a floating semiconductor pattern 118c.

Figure 3I:
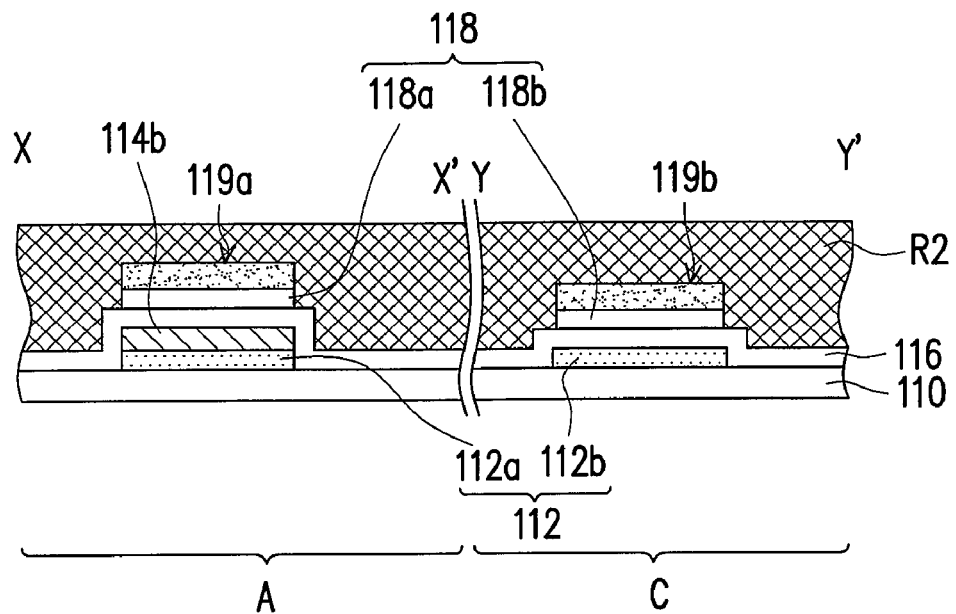
Figure 3J:
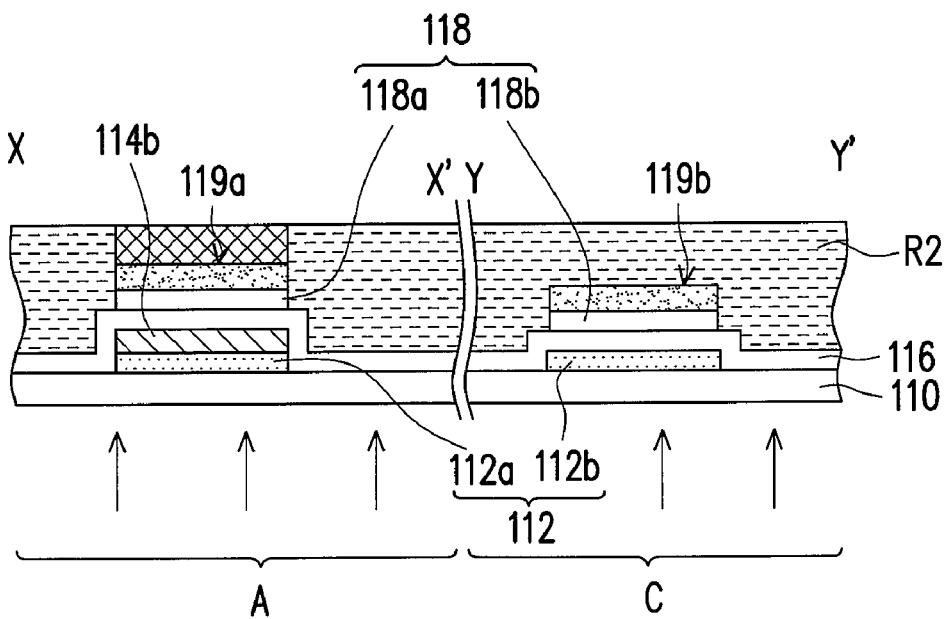
Figure 3K:
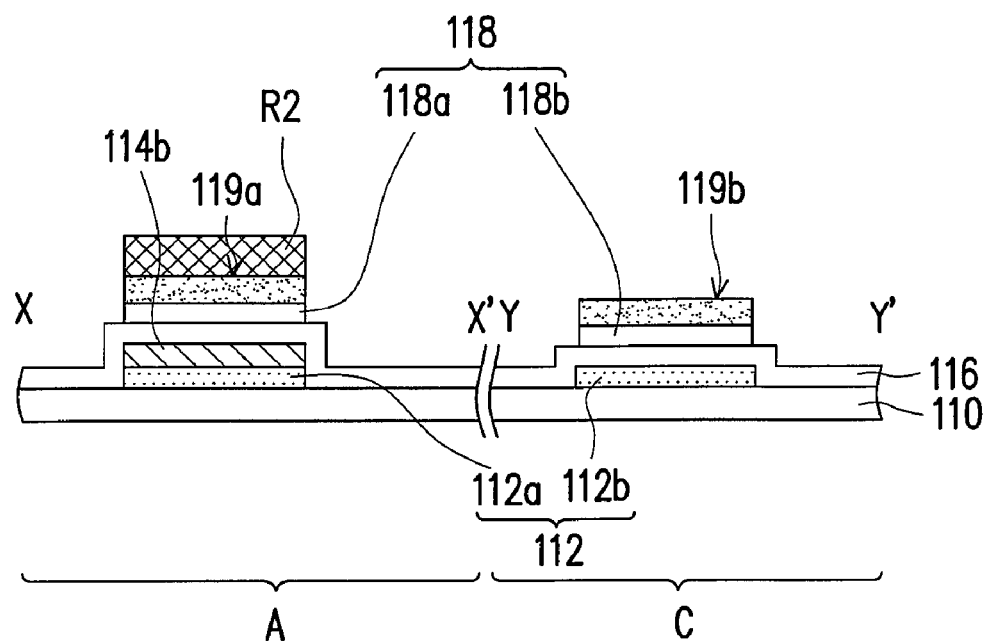
Figure 3L:
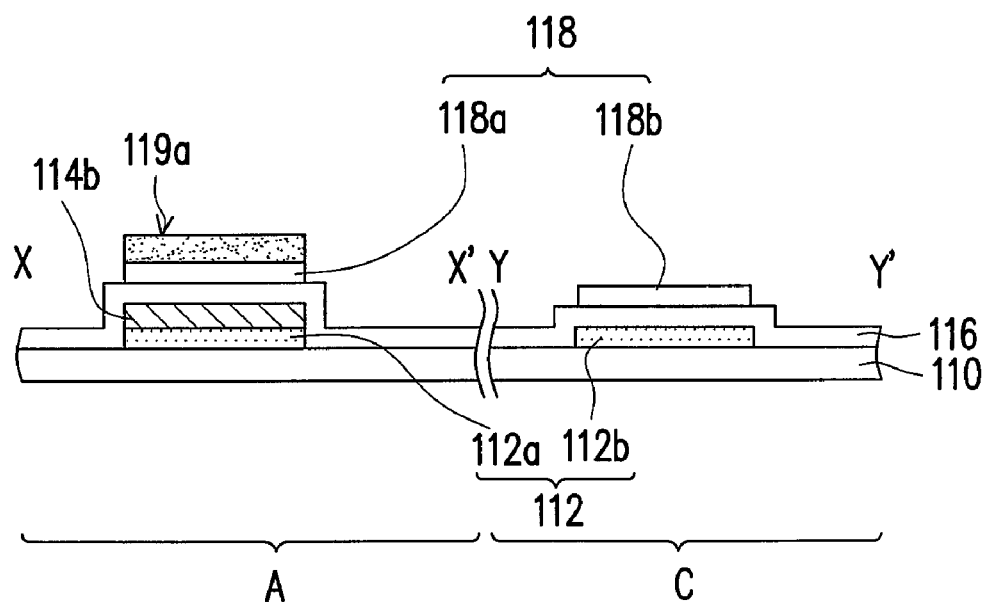
Figure 3M:
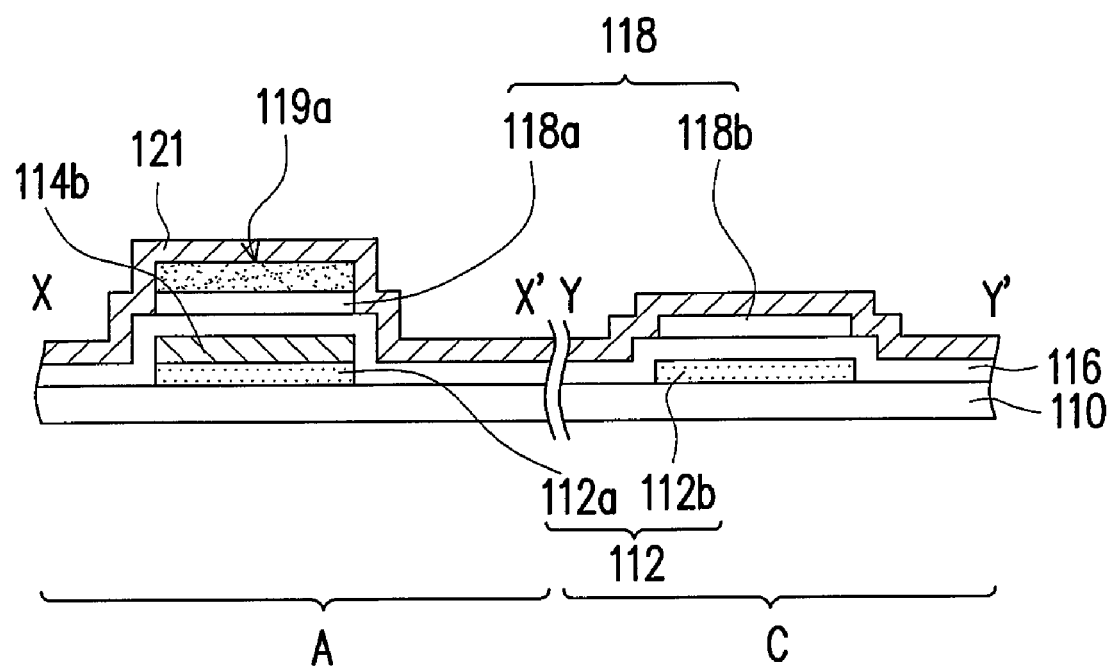
Figure 4E:
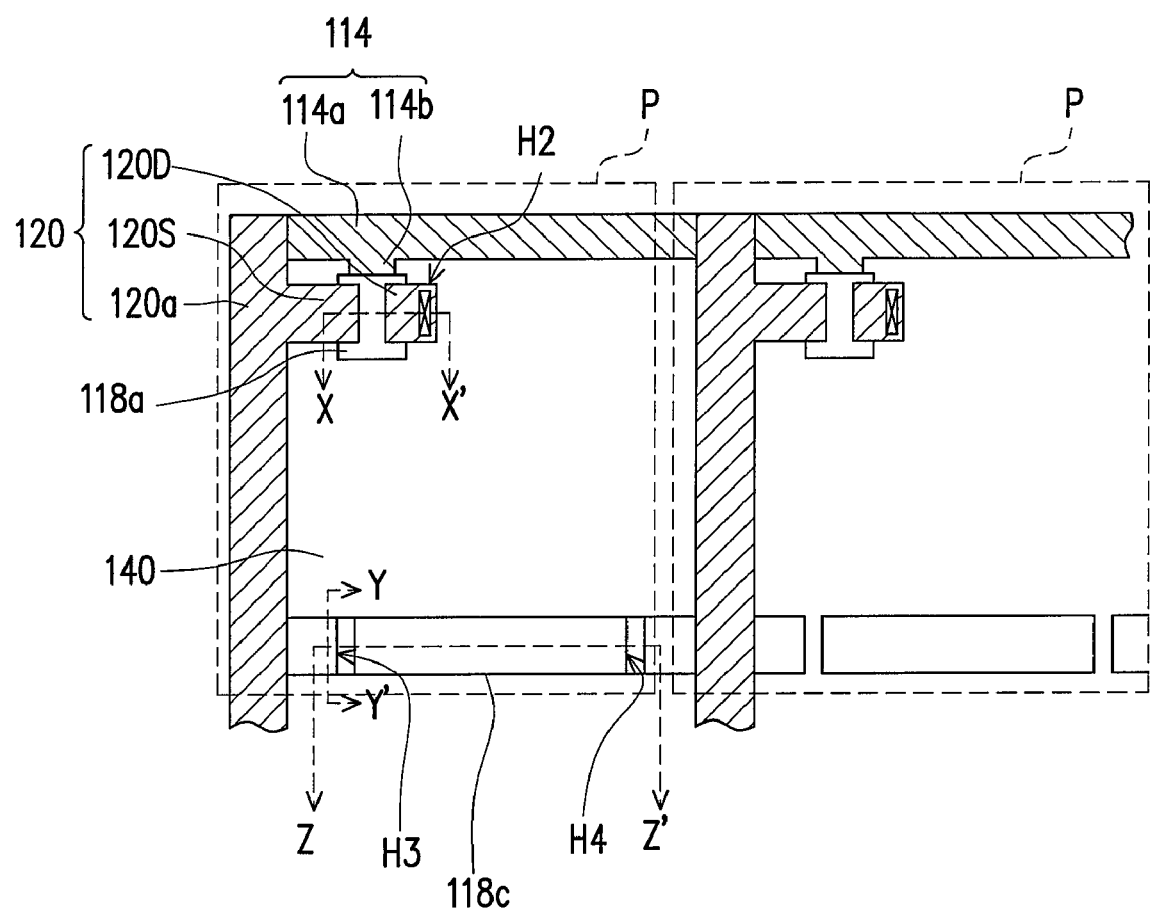
Figure 4F:
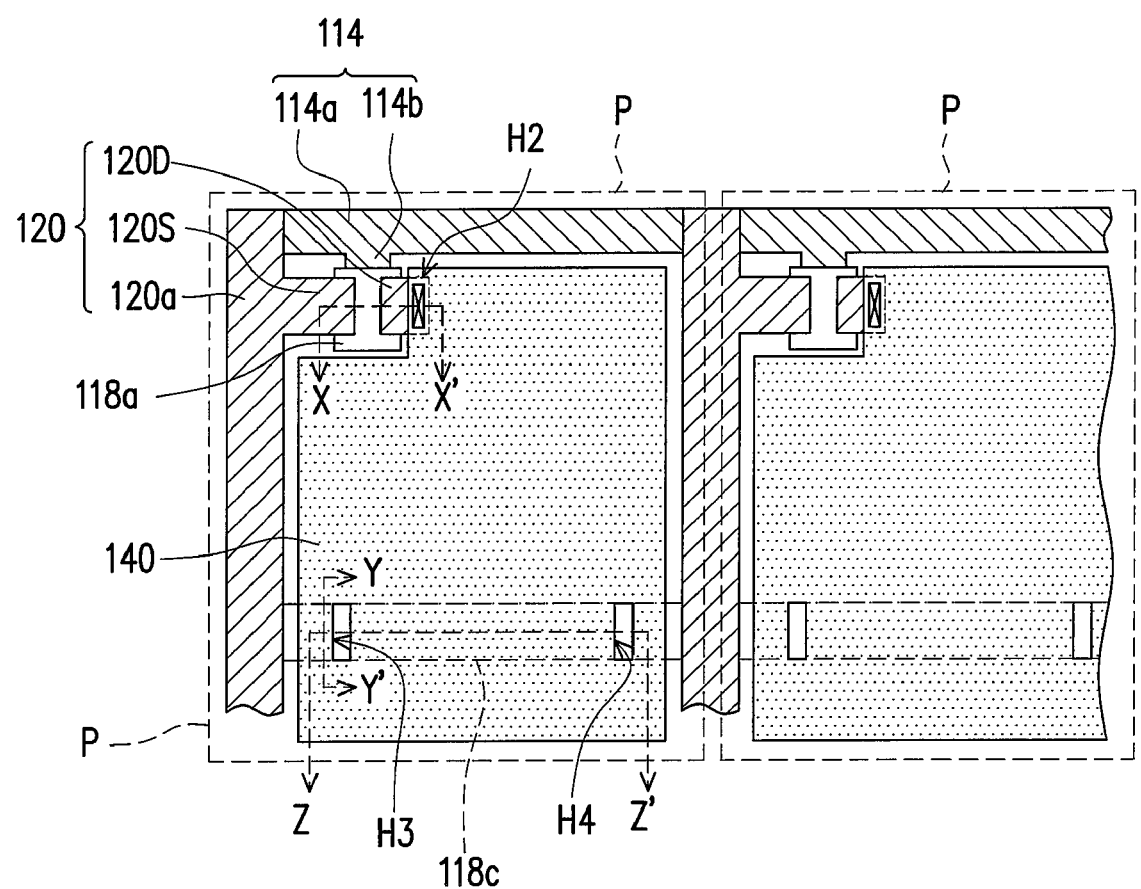

After that, referring to FIG. 3H and FIG. 4F, pixel electrodes 140 are formed on the dielectric layer 130. To be specific, a transparent electrode material is first deposited on the dielectric layer 130, and the transparent electrode material is filled in the contact window openings H2 to electrically connect with the drain 120D. The transparent electrode material may be the same material as that of the transparent conductive layer 112.

Thereafter, a mask process is performed to the transparent electrode material to form a pixel electrode 140 in each pixel preset region P, and the pixel electrode 140 may be electrically connected to the corresponding drain 120D via the corresponding contact window opening H2. The transparent electrode material in or over the slits H3 and H4 can be removed all together while patterning the transparent electrode material, so as to electrically insulate the floating semiconductor patterns 118c from other films. The pixel electrodes 140 are located over the common lines CL to form storage capacitors along with the corresponding common lines CL. As described above, the TFT array substrate 200 in the present invention has been completed.

As for forming the floating semiconductor patterns 118c, for another example, slits may be formed before the dielectric layer 130 is formed thereon. More specifically, after forming the semiconductor patterns 118b, slits may be formed in the semiconductor patterns 118b, thereby the floating semiconductor patterns 118c can be formed. Then, the dielectric layer 130 is entirely formed thereon.

The TFT array substrate 200 fabricated with foregoing method is illustrated in FIG. 3H and FIG. 4E, which includes a substrate 110, scan lines 114a, data lines 120a, first transparent conductive patterns 112a, second transparent conductive patterns 112b, gates 114b, sources 120S, drains 120D, a gate insulation layer 116, channel layers 118a, semiconductor patterns 118b, a dielectric layer 130, and pixel electrodes 140. The scan lines 114a and the data lines 120a are disposed on the substrate 110 to define a plurality of pixel preset regions P on the substrate 110, and each of the pixel preset regions P has an active device region A and a capacitor region C.

Moreover, the first transparent conductive patterns 112a are disposed within the corresponding active device regions A. The gates 114b are disposed on the first transparent conductive patterns 112a and are electrically connected to the corresponding scan lines 114a. The second transparent conductive patterns 112b are disposed within the corresponding capacitor regions C, and the second transparent conductive patterns 112b in adjacent pixel preset regions P are connected to each other to form the common lines CL which are parallel to the scan lines 114a.

In the present invention, the gate insulation layer 116 covers the scan lines 114a, the first transparent conductive patterns 112a, the second transparent conductive patterns 112b, and the gates 114b. The channel layers 118a are corresponding to the first transparent conductive patterns 112a and are disposed on the gate insulation layer 116 above the gates 114b. The semiconductor patterns 118b are corresponding to the second transparent conductive patterns 112b and are disposed on the gate insulation layer 116 above the second transparent conductive patterns 112b. As shown in FIG. 3H, the sources 120S and the drains 120D are respectively disposed at two sides of the channel layers 118a. The dielectric layer 130 may include a passivation layer 132 and a planarization layer 134 disposed on the passivation layer 132. The dielectric layer 130 may cover the channel layers 118a, the ohmic contact layer 119a, the semiconductor patterns 118b, the data lines 120a, the sources 120S, and the drains 120D. The pixel electrodes 140 are formed on the dielectric layer 130 and electrically connected to the corresponding drain 120D via the corresponding contact window opening H2 to complete a TFT. Furthermore, the pixel electrodes 140 and the corresponding common lines CL form storage capacitors.

In summary, according to the fabricating method of a TFT array substrate in the present invention, the semiconductor layer is patterned with the same mask as that for patterning the transparent conductive layer, thus, no additional mask is required for forming the common lines. Compared with conventional technique, the fabricating method of a TFT array substrate in the present invention can reduce the fabricating cost effectively. Moreover, since at least some of the common lines are fabricated with transparent conductive material, the pixel aperture ratio can be improved, and since the common lines of the TFT array substrate may also be formed by connecting a metal material and a transparent conductive material, the common lines have low resistance and so that the TFT array substrate has low power consumption and signal distortion can be avoided. A liquid crystal panel can use the TFT array substrate according to the embodiments of the present invention. The liquid crystal panel comprising the TFT array substrate according to the embodiments of the present invention, an opposite substrate and a liquid crystal layer disposed therebetween is provided. The opposite substrate may be a color filter or a substrate including another common electrode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a thin film transistor (TFT) array substrate, the fabricating method comprising:
   providing a substrate;
   forming a plurality of first transparent conductive patterns and a plurality of second transparent conductive patterns on the substrate;
   forming a plurality of scan lines, a plurality of gates and a plurality of connecting patterns, wherein one of the scan lines electrically connects one of the gates, each of the gates is disposed on one of the first transparent conductive patterns and each of the connecting patterns is electrically connected to two adjacent second transparent conductive patterns;
   forming a gate insulation layer on the plurality of scan lines, the plurality of gates and the connecting patterns;
   forming a plurality of channel layers each above each of the gates and a plurality of semiconductor patterns each above each of the second transparent conductive patterns;
   forming a plurality of data lines on the gate insulation layer and a plurality of sources and drains on the channel layers;
   forming a dielectric layer on plurality of data lines and the plurality of sources and drains, wherein the dielectric layer has a plurality of contact openings for respectively exposing the drains; and
   forming a plurality of pixel electrodes on the dielectric layer, wherein each pixel electrode is electrically connected to the corresponding drain via the corresponding contact opening.

2. The method as claimed in claim 1, wherein the plurality of channel layers each above each of the gates and the plurality of semiconductor patterns each above each of the second transparent conductive patterns are formed by the same mask as that for forming the first transparent conductive patterns and the second transparent conductive patterns.

3. The method as claimed in claim 1, further comprising:
   performing a doping process to the channel layers to form a plurality of ohmic contact layers correspondingly on the surface of the channel layers.

4. The method as claimed in claim 1, wherein the step of forming the dielectric layer comprises sequentially forming a passivation layer and a planarization layer.

5. A TFT array substrate, comprising:
a substrate;
a plurality of first transparent conductive patterns and a plurality of second transparent conductive patterns disposed on the substrate;
a plurality of scan lines disposed on the substrate;
a plurality of gates respectively disposed on the first transparent conductive patterns and connected to the corresponding scan lines;
a plurality of connecting patterns disposed on the substrate, each respectively electrically connecting the two adjacent second transparent conductive patterns;
a gate insulation layer covering the scan lines, the first transparent conductive patterns, the gates, the second transparent conductive patterns, and the connecting patterns;
a plurality of channel layers respectively corresponding to the first transparent conductive patterns, the channel layers being disposed on the gate insulation layer above the gates;
a plurality of sources and drains respectively disposed at two sides of the channel layers;
a plurality of data lines disposed on the gate insulation layer and electrically connected to the sources;
a dielectric layer disposed over the channel layers, the data lines, and the sources and drains, the dielectric layer having a plurality of contact openings for respectively exposing the drains; and
a plurality of pixel electrodes disposed on the dielectric layer, each pixel electrode being electrically connected to the corresponding drain via the corresponding contact opening.

6. The TFT array substrate as claimed in claim 5, further comprising a plurality of semiconductor patterns respectively corresponding to the second transparent conductive patterns, the semiconductor patterns being disposed on the gate insulation layer above the second transparent conductive patterns.

7. The TFT array substrate as claimed in claim 5, wherein the material of the channel layers and the semiconductor patterns comprises amorphous silicon.

8. The TFT array substrate as claimed in claim 5, wherein the material of the pixel electrodes comprises ITO, IZO, AZO or combinations thereof.

9. The TFT array substrate as claimed in claim 5 further comprising an ohmic contact layer disposed between each channel layer and the corresponding source and drain.

10. The TFT array substrate as claimed in claim 5, wherein the dielectric layer comprises a passivation layer and a planarization layer disposed on the passivation layer.

11. A fabricating method of a TFT array substrate, the fabricating method comprising:
providing a substrate;
forming a patterned transparent conductive layer on the substrate to form a plurality of transparent conductive patterns and a plurality of common lines;
forming a patterned first metal layer to form a plurality of scan lines, each of the scan lines extending a gate on one of the transparent conductive pattern;
forming an gate insulation layer over the substrate;
forming a patterned semiconductor layer on the gate insulation layer to form a channel layer above each of the gates and a semiconductor pattern above each of the common lines, wherein the semiconductor layer is patterned with the same mask as the that for forming the patterned transparent conductive layer;
forming a patterned second metal layer to form a plurality of data lines and to form a plurality of sources and a plurality of drains respectively disposed at two sides of each channel layer, wherein each source is connected to the corresponding data line;
forming a patterned dielectric layer over the channel layers, the semiconductor patterns, the data lines, and the sources and drains, wherein the dielectric layer has a plurality of contact openings for respectively exposing the drains and separating two ends of the semiconductor pattern to form a floating semiconductor pattern; and
forming a plurality of pixel electrodes on the dielectric layer, wherein each pixel electrode is electrically connected to the corresponding drain via the corresponding contact opening.

12. The method as claimed in claim 11, wherein the transparent conductive layer has the same material as that of the pixel electrodes.

13. The method as claimed in claim 11, further comprising performing an ion doping process to the semiconductor layer to form an ohmic contact layer on the surface of the semiconductor layer.

14. The method as claimed in claim 11, wherein the step of forming the dielectric layer comprises sequentially forming a passivation layer and a planarization layer.

15. A TFT array substrate, comprising:
a substrate;
a plurality of transparent conductive patterns disposed on the substrate;
a plurality of scan lines disposed on the substrate, the scan lines being adjacent to their corresponding transparent conductive patterns, respectively;
a plurality of common lines disposed on the substrate, the common lines being parallel to the scan lines;
a plurality of gates respectively disposed on the transparent conductive patterns and connected to the corresponding scan lines;
a gate insulation layer covering the scan lines, the transparent conductive patterns, the common lines, and the gates;
a plurality of channel layers respectively corresponding to the transparent conductive patterns, the channel layers being disposed on the gate insulation layer above the gates;
a plurality of sources and drains respectively disposed at two sides of the channel layers;
a plurality of data lines disposed on the gate insulation layer and electrically connected to the sources, the data lines intersecting with but not electrically connected to the scan lines and the common lines;
a dielectric layer disposed over the channel layers, the data lines, the sources and drains, the dielectric layer having a plurality of contact opening for respectively exposing the drains; and
a plurality of pixel electrodes disposed on the dielectric layer and electrically connected to the corresponding drain via the corresponding contact opening.

16. The TFT array substrate as claimed in claim 15, wherein the transparent conductive patterns and the common lines are made of the same layer.

17. The TFT array substrate as claimed in claim 15, further comprising a plurality of semiconductor patterns respectively corresponding to the common lines, the semiconductor patterns being disposed on the gate insulation layer above the common lines.

18. The TFT array substrate as claimed in claim 15, wherein the material of the transparent conductive patterns and the common lines comprises ITO, IZO, AZO or combinations thereof 19. The TFT array substrate as claimed in claim 15, further comprising an ohmic contact layer disposed between each of the channel layers and the corresponding source and drain.

20. The TFT array substrate as claimed in claim 15, wherein the dielectric layer comprises a passivation layer and a planarization layer disposed on the passivation layer.

* * * * *